United States Patent
Nakao et al.

(10) Patent No.: US 10,627,455 B2
(45) Date of Patent: Apr. 21, 2020

(54) CAPACITOR LIFE DIAGNOSIS APPARATUS AND CAPACITOR LIFE DIAGNOSIS METHOD

(71) Applicant: FUJITSU LIMITED, Kawasaki-shi, Kanagawa (JP)

(72) Inventors: Hiroshi Nakao, Yamato (JP); Yu Yonezawa, Sagamihara (JP); Takahiko Sugawara, Kawasaki (JP); Yoshiyasu Nakashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 63 days.

(21) Appl. No.: 15/455,179

(22) Filed: Mar. 10, 2017

(65) Prior Publication Data

US 2017/0292984 A1 Oct. 12, 2017

(30) Foreign Application Priority Data

Apr. 7, 2016 (JP) .................. 2016-077542

(51) Int. Cl.
G01R 31/64 (2020.01)
G01R 31/00 (2006.01)
G01R 31/40 (2020.01)

(52) U.S. Cl.
CPC ........... *G01R 31/64* (2020.01); *G01R 31/003* (2013.01); *G01R 31/40* (2013.01)

(58) Field of Classification Search
CPC .... G01R 31/028; G01R 31/003; G01R 31/44; G01R 31/40
See application file for complete search history.

(56) References Cited

U.S. PATENT DOCUMENTS

| 4,193,026 A | * | 3/1980 | Finger | G01R 19/16542 324/428 |
| 2010/0254172 A1 | * | 10/2010 | Hattori | H02M 7/53871 363/132 |
| 2012/0232814 A1 | * | 9/2012 | Hofmeister | G01R 31/40 702/60 |
| 2015/0073739 A1 | * | 3/2015 | Khan | G01R 23/02 702/78 |
| 2016/0334850 A1 | * | 11/2016 | Lee | G06F 1/30 |

FOREIGN PATENT DOCUMENTS

| JP | 1-260369 | 10/1989 |
| JP | 8-248086 | 9/1996 |
| JP | 11-231008 | 8/1999 |
| JP | 2002-44938 A | 2/2002 |
| JP | 2006-133046 | 5/2006 |
| JP | 2011-108518 A | 6/2011 |

OTHER PUBLICATIONS

Japanese Office Action dated Nov. 19, 2019 for corresponding Japanese Patent Application No. 2016-077542 with English Translation, 7 pages.

* cited by examiner

*Primary Examiner* — Akm Zakaria
(74) *Attorney, Agent, or Firm* — Fujitsu Patent Center

(57) ABSTRACT

A capacitor life diagnosis apparatus includes ringing detection circuitry that detects ringing of an output voltage of a power source including a capacitor at an output end, and signal generation circuitry that generates a signal indicating a life of the capacitor based on the ringing detected by the ringing detection circuitry.

12 Claims, 26 Drawing Sheets

FIG. 4C
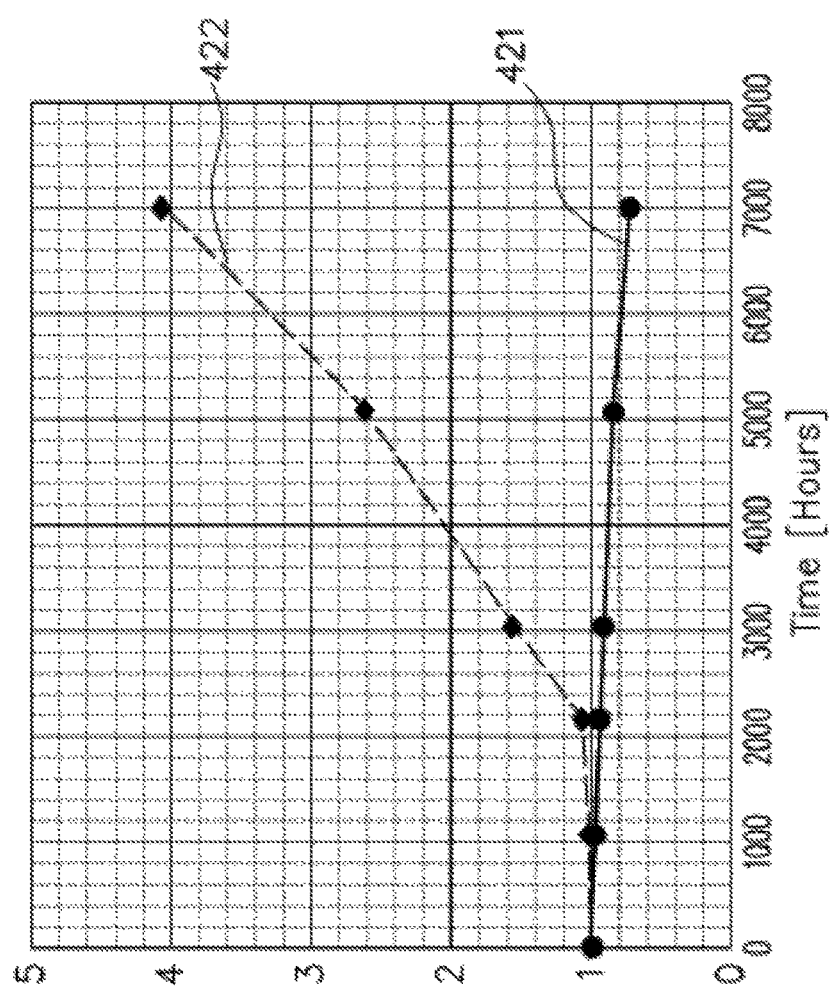
FIG. 4A
FIG. 4B
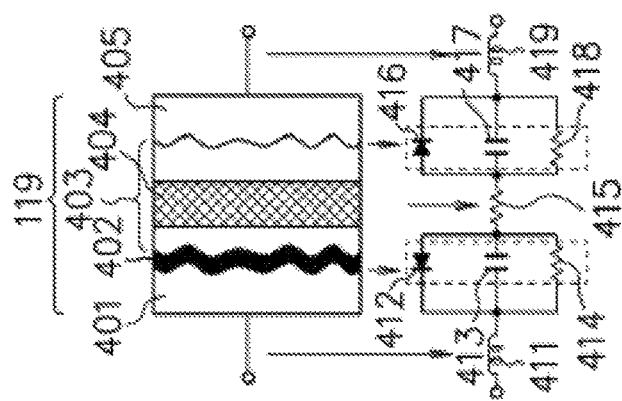

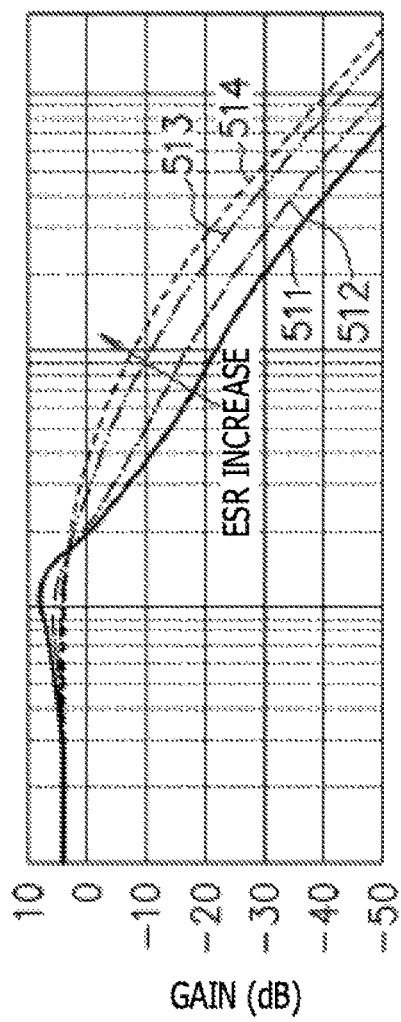
FIG. 5B
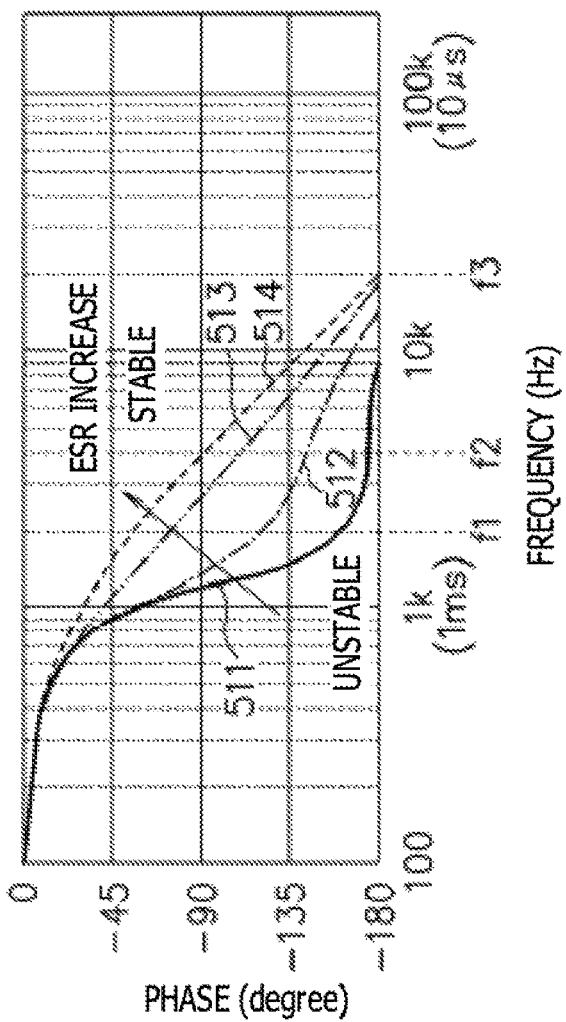
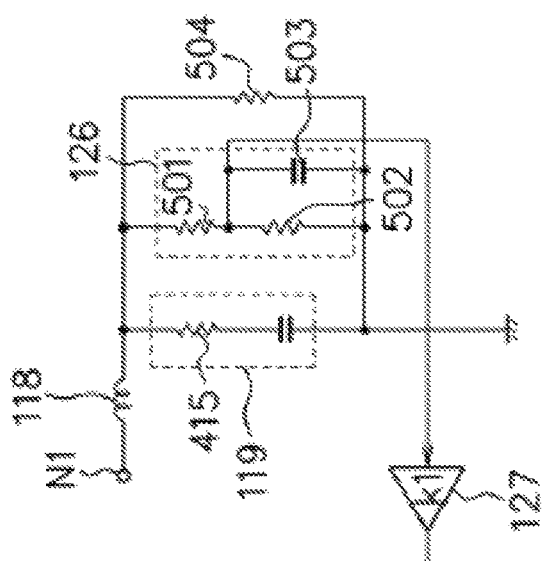
FIG. 5A
FIG. 5C

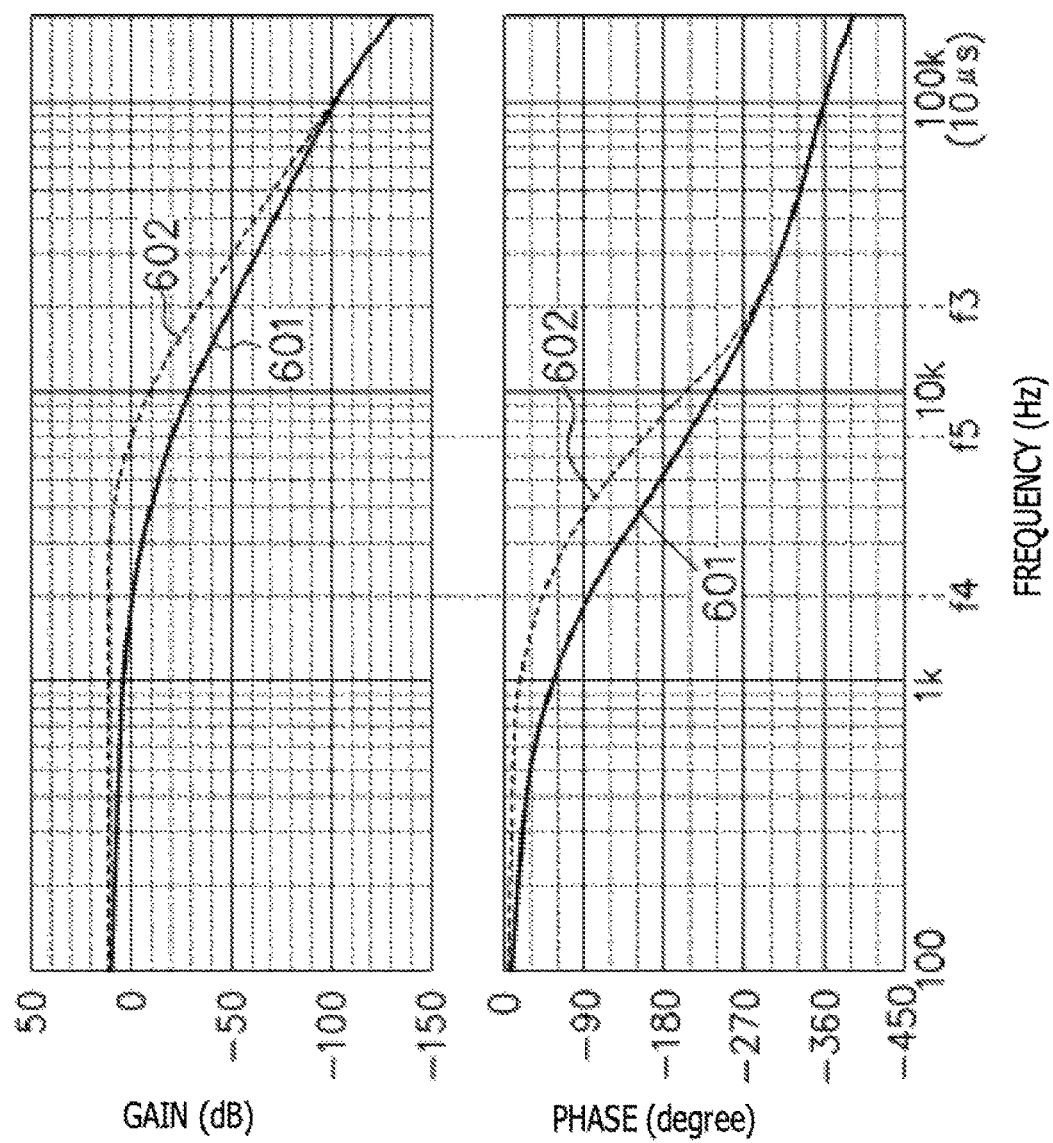
FIG. 6B
FIG. 6C
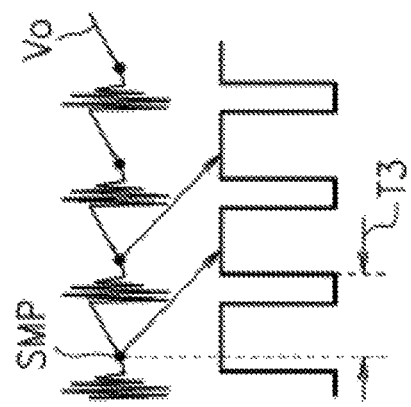
FIG. 6A

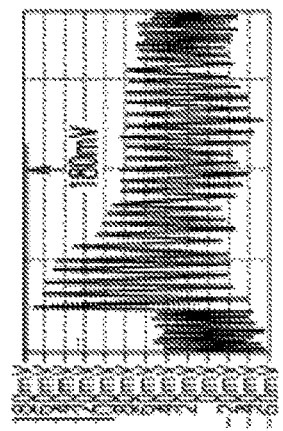 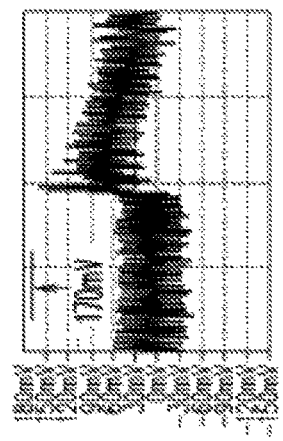 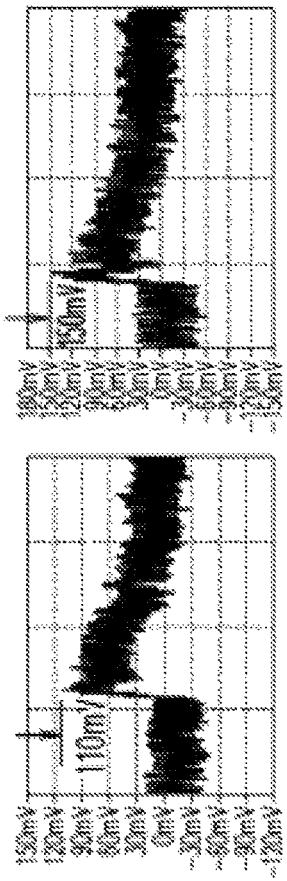
FIG. 7A  FIG. 7B  FIG. 7C  FIG. 7D
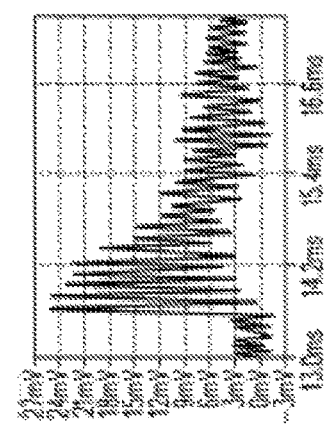 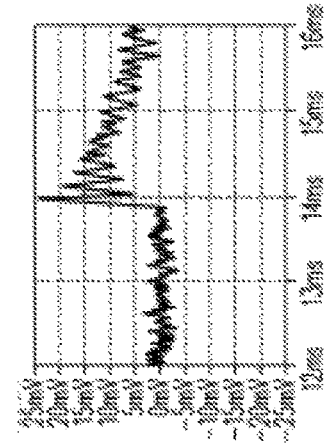 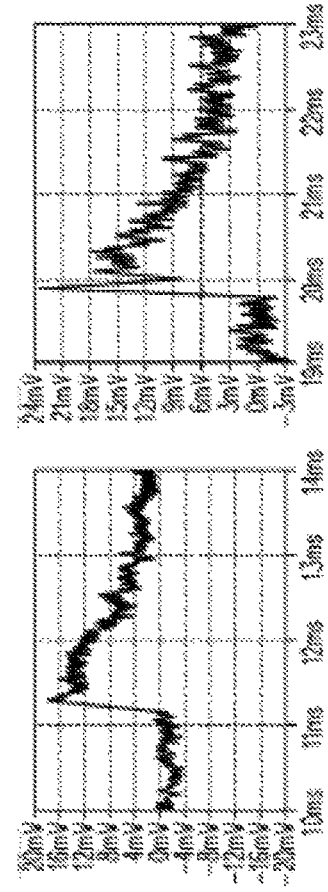
FIG. 7E  FIG. 7F  FIG. 7G  FIG. 7H

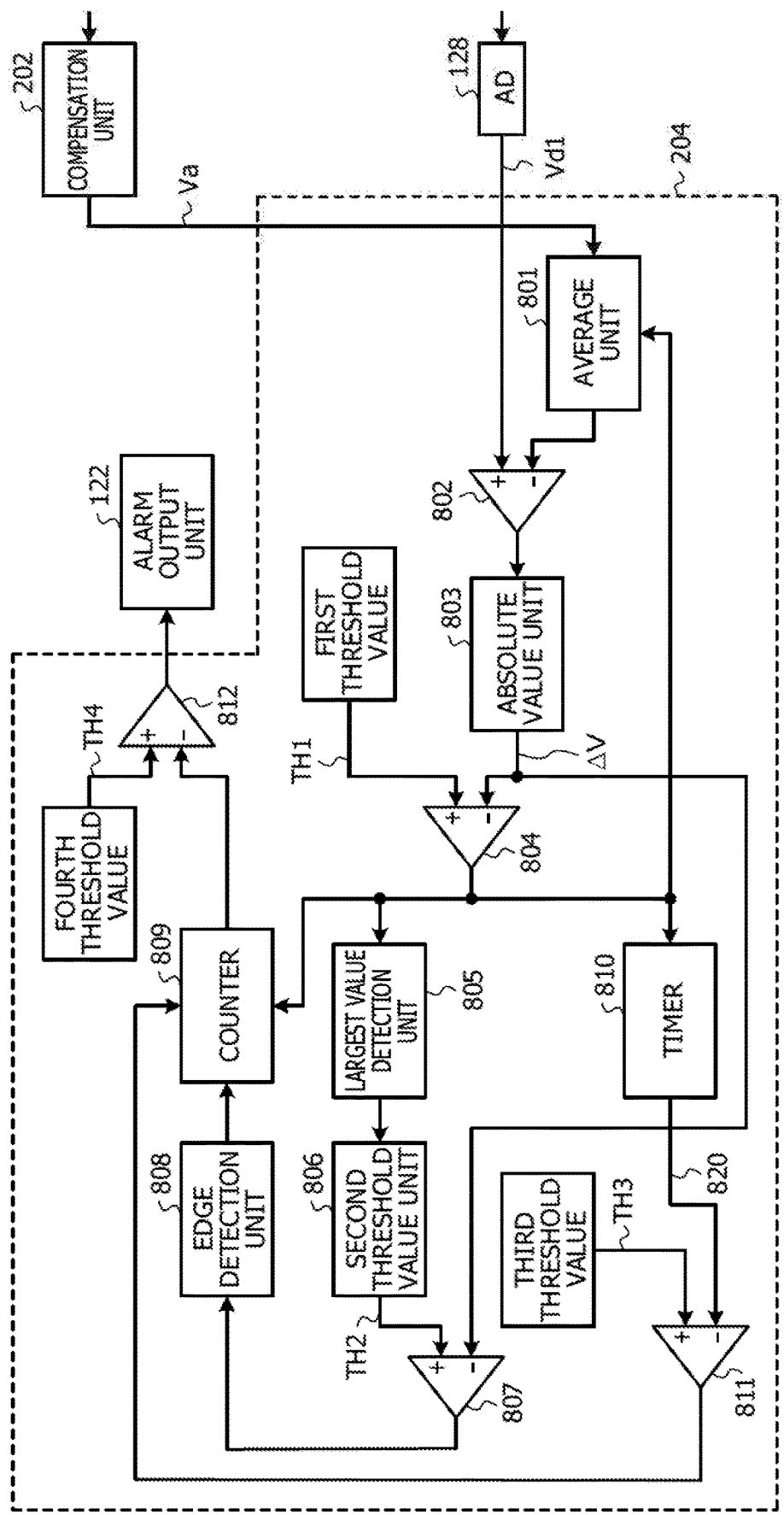

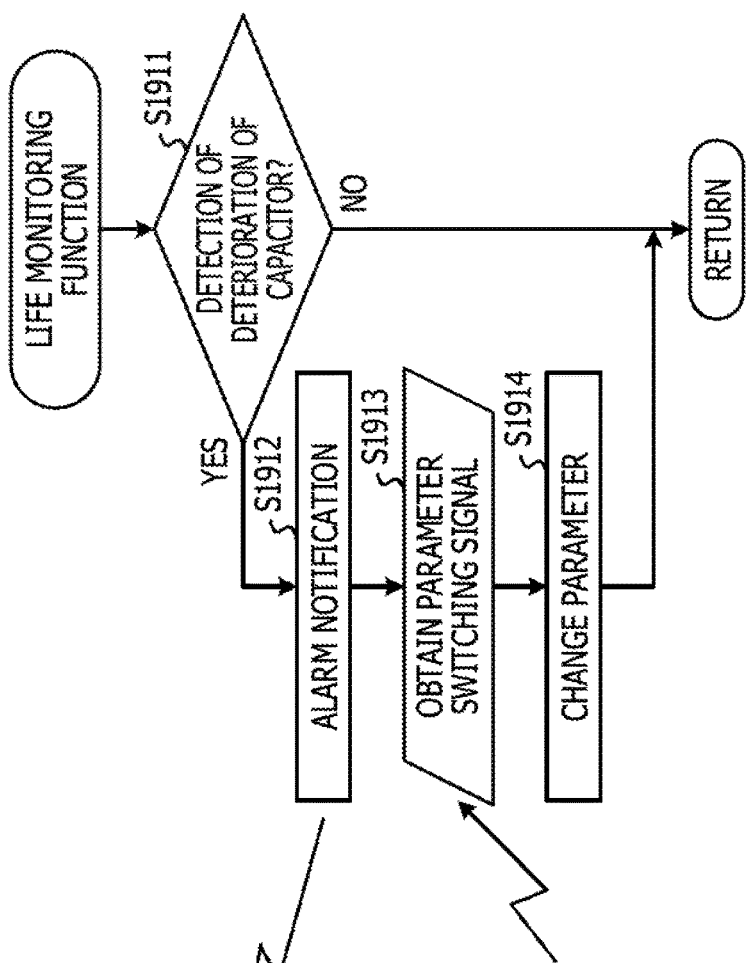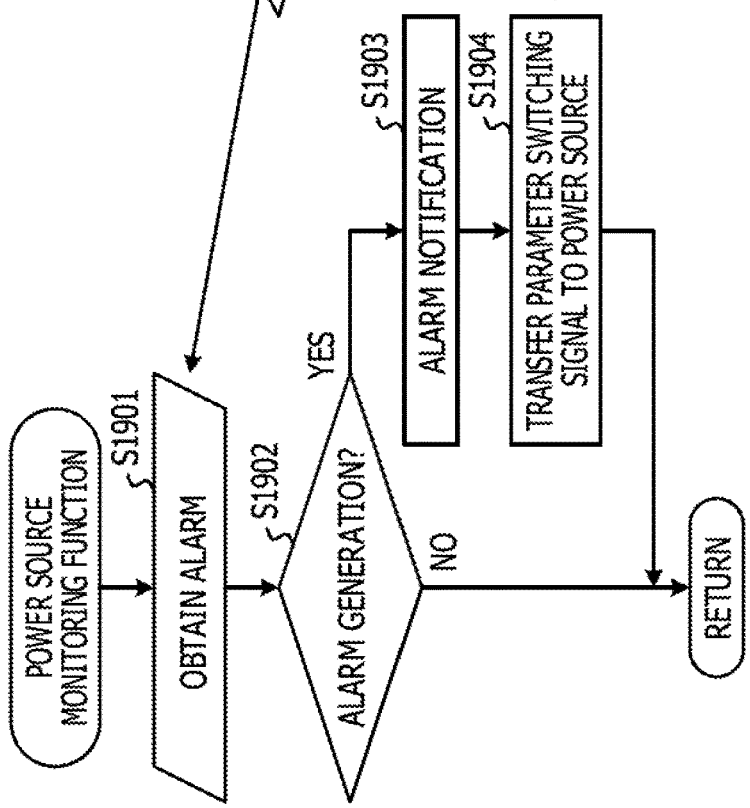
FIG. 19A
FIG. 19B

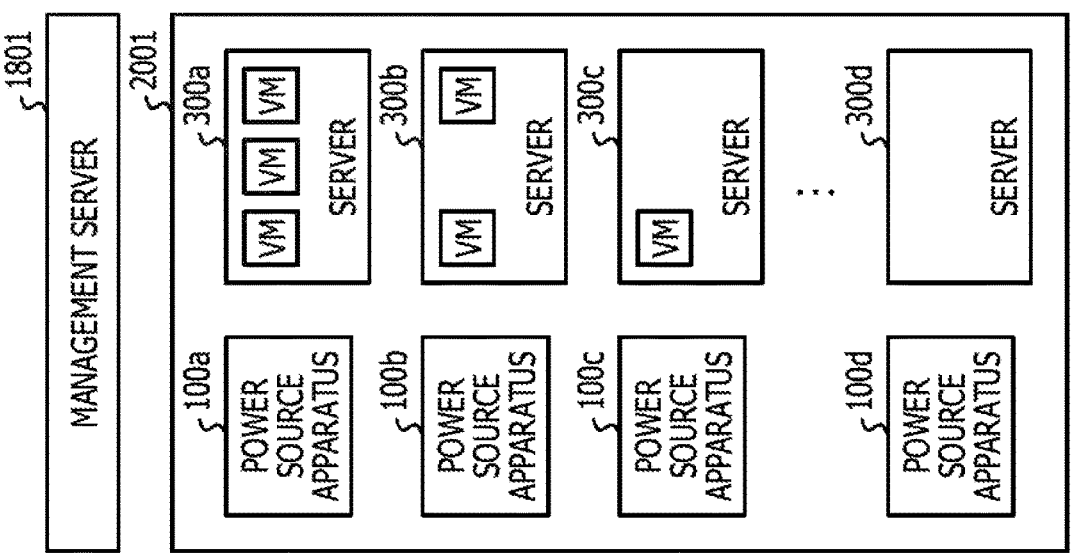
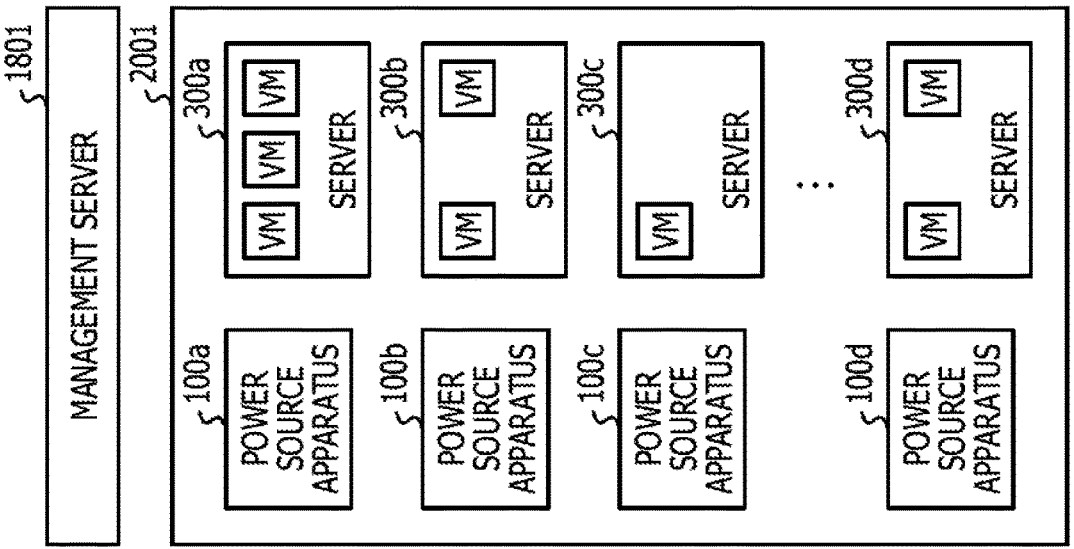
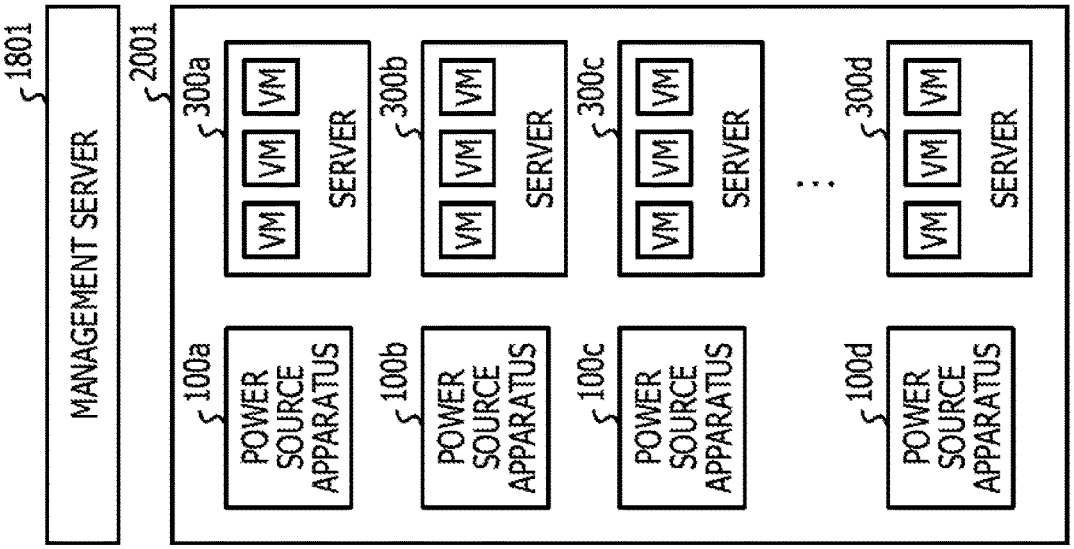

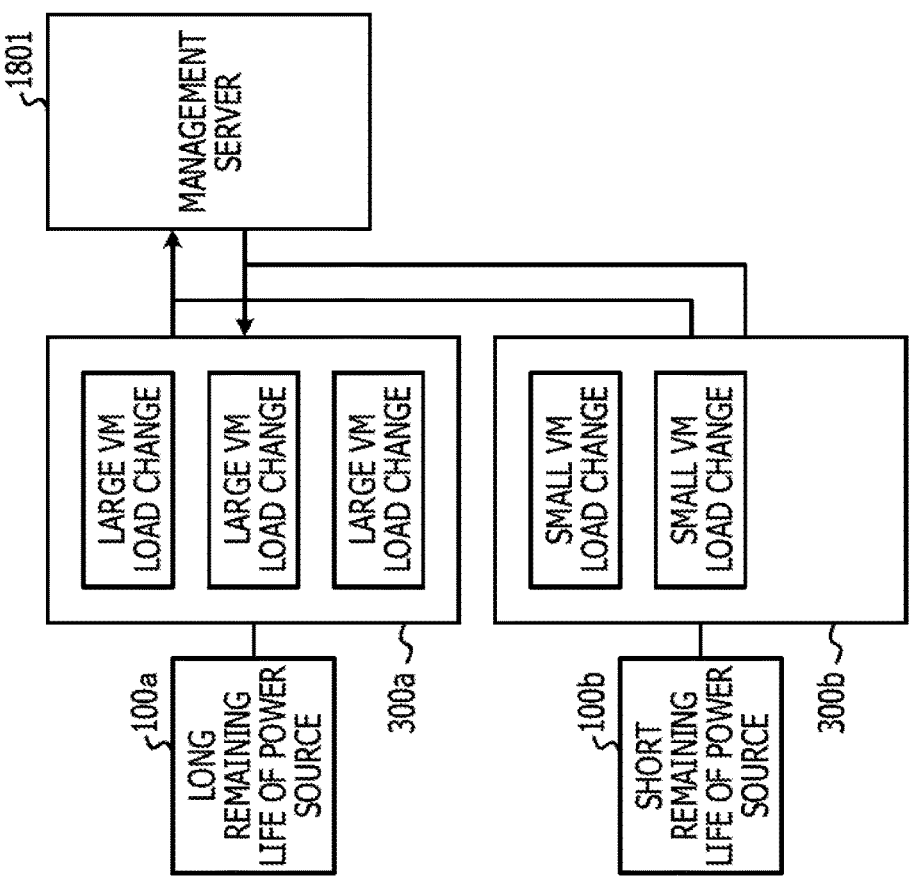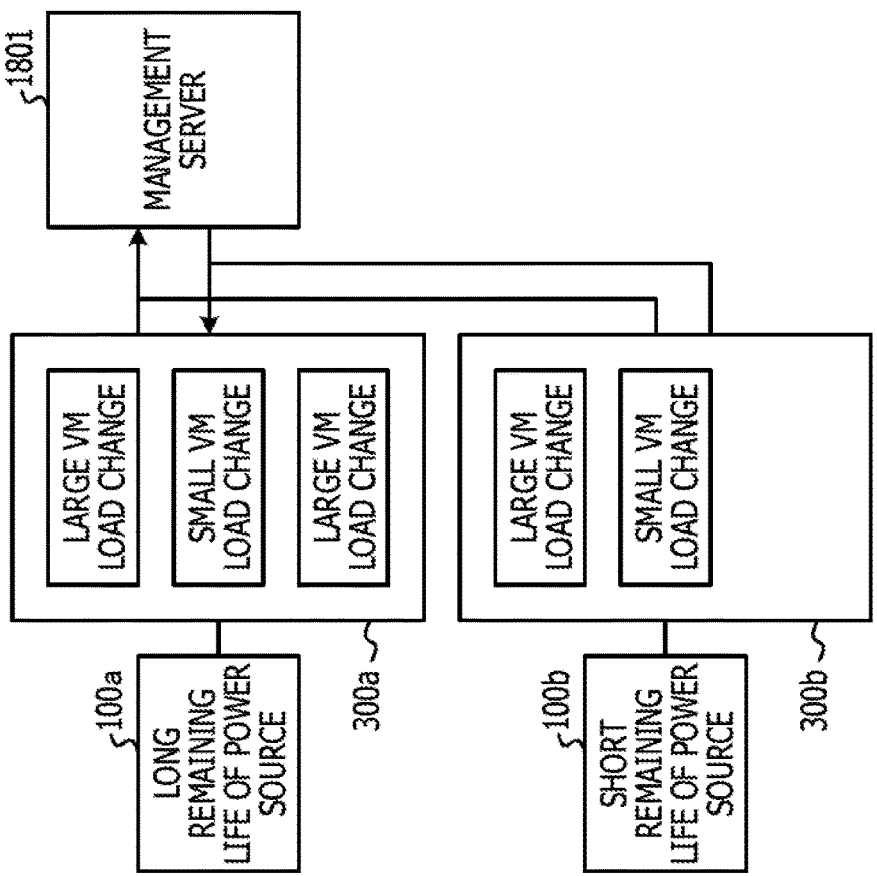

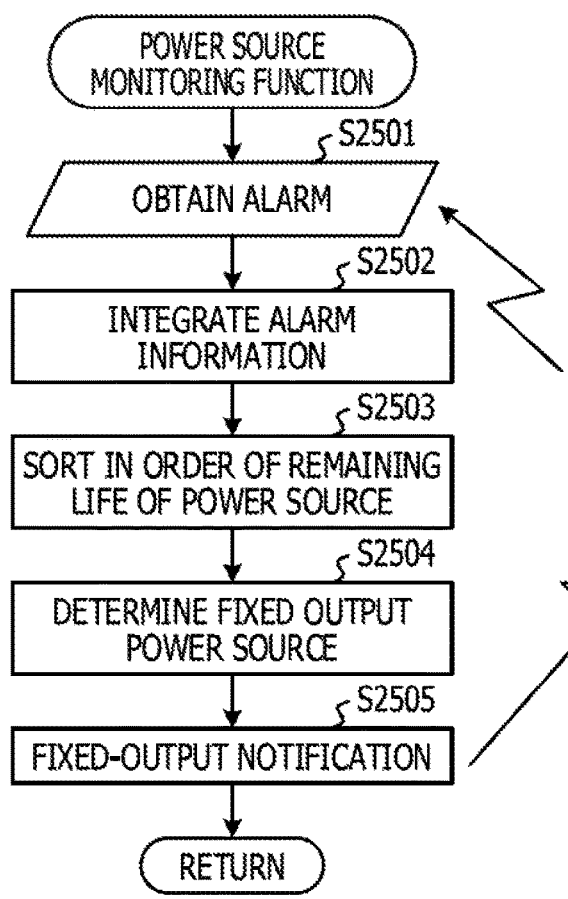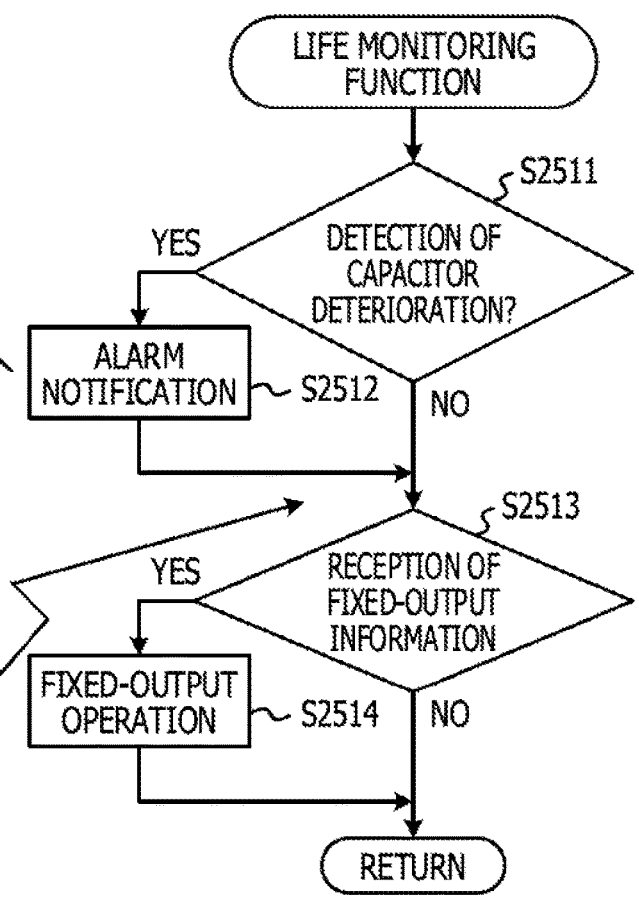

CAPACITOR LIFE DIAGNOSIS APPARATUS AND CAPACITOR LIFE DIAGNOSIS METHOD

CROSS-REFERENCE TO RELATED APPLICATION

This application is based upon and claims the benefit of priority of the prior Japanese Patent Application No. 2016-077542, filed on Apr. 7, 2016, the entire contents of which are incorporated herein by reference.

FIELD

The embodiments discussed herein are related to a capacitor life diagnosis apparatus and a capacitor life diagnosis method.

BACKGROUND

An electrolytic capacitor deterioration determination circuit which constitutes a ripple voltage detection circuit of an electrolytic capacitor using a capacitor for cutting direct current (DC) and an insulation transformer has been widely used. An LC tuning circuit detects a ripple voltage detection signal as a sine waveform. A rectifier circuit rectifies the sine wave detection signal. A deterioration detection unit compares a rectification signal with a reference signal.

In a power source apparatus, a ripple of an electrolytic capacitor is preferably small, and therefore, a ripple is small. If a ripple is small, it is difficult to determine deterioration of the electrolytic capacitor with high accuracy based on the ripple.

The following is a reference document.
[Document 1] Japanese Laid-open Patent Publication No. 8-248086.

SUMMARY

According to an aspect of the invention, a capacitor life diagnosis apparatus includes: ringing detection circuitry that detects ringing of an output voltage of a power source including a capacitor at an output end; and signal generation circuitry that generates a signal indicating a life of the capacitor based on the ringing detected by the ringing detection circuitry.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4C are diagrams illustrating an electrolytic capacitor;

FIGS. 5A to 5C are diagrams illustrating influence of increase of an equivalent series resistance (ESR) when an analog-control compensator is used;

FIGS. 6A to 6C are diagrams illustrating influence of increase of an ESR of the power source apparatus illustrated in FIGS. 1 and 2;

FIGS. 7A to 7D are diagrams illustrating waveforms of an output voltage of the electrolytic capacitor and FIGS. 7E to 7H are diagrams illustrating waveforms of an output voltage of a low-pass filter;

FIG. 8 is a diagram illustrating a ringing evaluation unit of FIG. 2;

FIG. 19A is a flowchart illustrating a process performed by a management server and FIG. 19B is a flowchart illustrating a process performed by a power source apparatus;

FIGS. 20A to 20C are diagrams illustrating a power source system according to a fifth embodiment;

FIGS. 22A and 22B are diagrams illustrating a power source system according to a sixth embodiment;

FIG. 25A is a flowchart of a process performed by a management server, and FIG. 25B is a flowchart of a process performed by a power source apparatus.

DESCRIPTION OF EMBODIMENTS

First Embodiment

Figure 1:
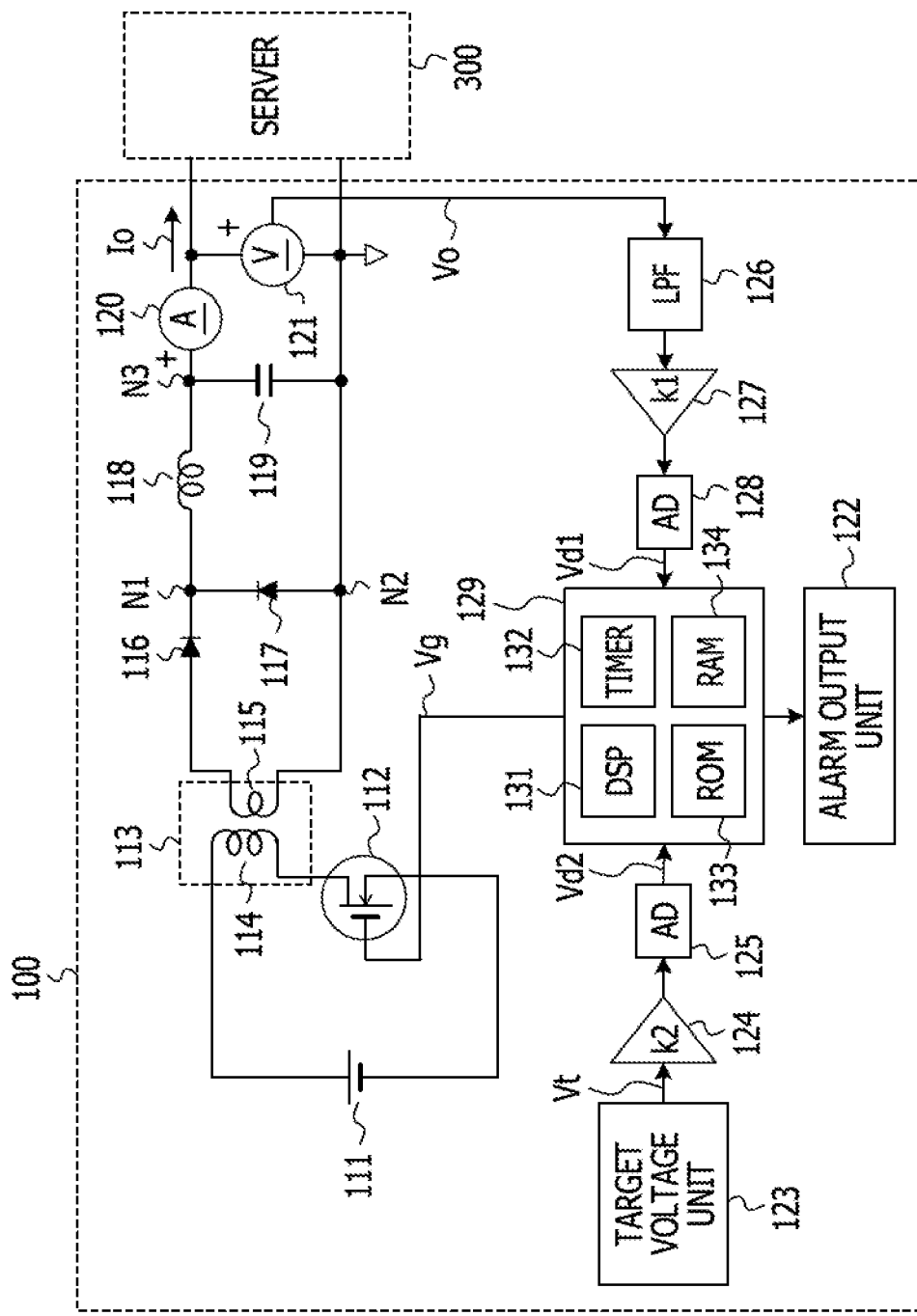
FIG. 1 is a diagram illustrating a configuration of a power source system according to a first embodiment.

FIG. 1 is a diagram illustrating a configuration of a power source system according to a first embodiment. The power source system includes a power source apparatus 100 and a server 300. The power source apparatus 100 is a direct current (DC)—direct current (DC) power source apparatus and includes a capacitor life diagnosis apparatus. The power source apparatus 100 further includes a DC power source 111, an n-channel field effect transistor 112, a transistor 113, diodes 116 and 117, an inductor 118, an electrolytic capacitor 119, a current detection unit 120, and a voltage detection unit 121. The power source apparatus 100 further includes an alarm output unit 122, a target voltage unit 123, a gain unit 124, an analog-digital converter 125, a low-pass filter 126, a gain unit 127, an analog-digital converter 128, and a microcomputer 129, as the capacitor life diagnosis apparatus.

The transistor 113 includes a primary coil 114 and a secondary coil 115. The field effect transistor 112 is preferably a high electron mobility transistor (HEMT) of a gallium nitride (GaN) or may be a metal oxide semiconductor (MOS) field effect transistor. The HEMT has an advantage in high voltage resistance and high speed switching. The power source apparatus 100 drops a DC voltage of the DC power source 111 and supplies the dropped DC voltage to the server 300 as a power source voltage. The power source apparatus 100 may supply a DC voltage to electronic apparatuses other than the server 300. In a stage before the power source apparatus 100, an AC/CD power source circuit which converts alternate current (AC) electric power into DC electric power may be provided.

The DC power source 111 outputs a DC voltage of 400 V, for example. The primary coil 114 of the transistor 113 is connected between a positive electrode terminal of the DC power source 111 and a drain of the field effect transistor 112. The n-channel field effect transistor 112 has a gate connected to the microcomputer 129 and a source connected to a negative electrode terminal of the DC power source 111. The secondary coil 115 is connected between an anode of the diode 116 and a node N2. The node N2 is a ground potential node. A cathode of the diode 116 is connected to a node N1. The diode 117 has an anode connected to the node N2 and a cathode connected to the node N1. The inductor 118 is connected between the node N1 and a node N3. The electrolytic capacitor 119 is connected between the nodes N2 and N3.

The transistor 113 transforms a voltage of the primary coil 114 and outputs the transformed voltage to the secondary coil 115. Specifically, when a voltage is applied to the primary coil 114, a voltage lower than the voltage of the primary coil 114 is generated in the secondary coil 115. The diodes 116 and 117 constitute a rectification circuit which rectifies the voltage of the secondary coil 115.

The inductor 118 and the electrolytic capacitor 119 constitute a smoothing circuit which smooths the voltage of the node N1 and outputs the smoothed voltage. The output voltage of the electrolytic capacitor 119 is a DC voltage of 12 V, for example, to be supplied to the server 300 as a power source voltage. The server 300 is a load to the power source apparatus 100.

The current detection unit 120 detects an output current Io of the electrolytic capacitor 119. The voltage detection unit 121 detects an output voltage Vo of the electrolytic capacitor 119.

The low-pass filter 126 outputs the output voltage Vo after attenuating frequency components higher than a cutoff frequency in the output voltage Vo. The gain unit 127 outputs a voltage obtained by multiplying the output voltage of the low-pass filter 126 by a gain k1. The analog-digital converter 128 converts the output voltage of the gain unit 127 into a digital output voltage Vd1 to be output to the microcomputer 129.

The target voltage unit 123 outputs a target voltage Vt. The target voltage Vt is 12 V, for example. The gain unit 124 outputs a voltage obtained by multiplying the target voltage Vt by the gain k2. The analog-digital converter 125 converts the analog output voltage of the gain unit 124 into a digital target voltage Vd2 to be output to the microcomputer 129.

The microcomputer 129 is a computer including a digital signal processor (DSP) 131, a timer 132, a read only memory (ROM) 133, and a random access memory (RAM) 134. The DSP 131 performs a digital signal process. The timer 132 counts a timer value. The ROM 133 stores programs and the like. The RAM 134 is a working area of the DSP 131. The DSP 131 performs various processes by executing the programs stored in the ROM 133.

The gate of the field effect transistor 112 receives a gate voltage Vg of a high-frequency pulse. The microcomputer 129 controls a pulse width of the gate voltage Vg of the field effect transistor 112 in accordance with the digital output voltage Vd1. Specifically, the microcomputer 129 increases a pulse width of the gate voltage Vg of the field effect transistor 112 when the digital output voltage Vd1 is lower than the target voltage Vd2 whereas the microcomputer 129 reduces the pulse width of the gate voltage Vg of the field effect transistor 112 when the digital output voltage Vd1 is higher than the digital target voltage Vd2. In this way, feedback control is performed such that an output voltage Vo of the electrolytic capacitor 119 becomes the target voltage Vt (12 V, for example).

Furthermore, the microcomputer 129 diagnoses a life of the electrolytic capacitor 119 based on the digital output voltage Vd1 and outputs a signal indicating the life of the electrolytic capacitor 119 to the alarm output unit 122.

Figure 2:
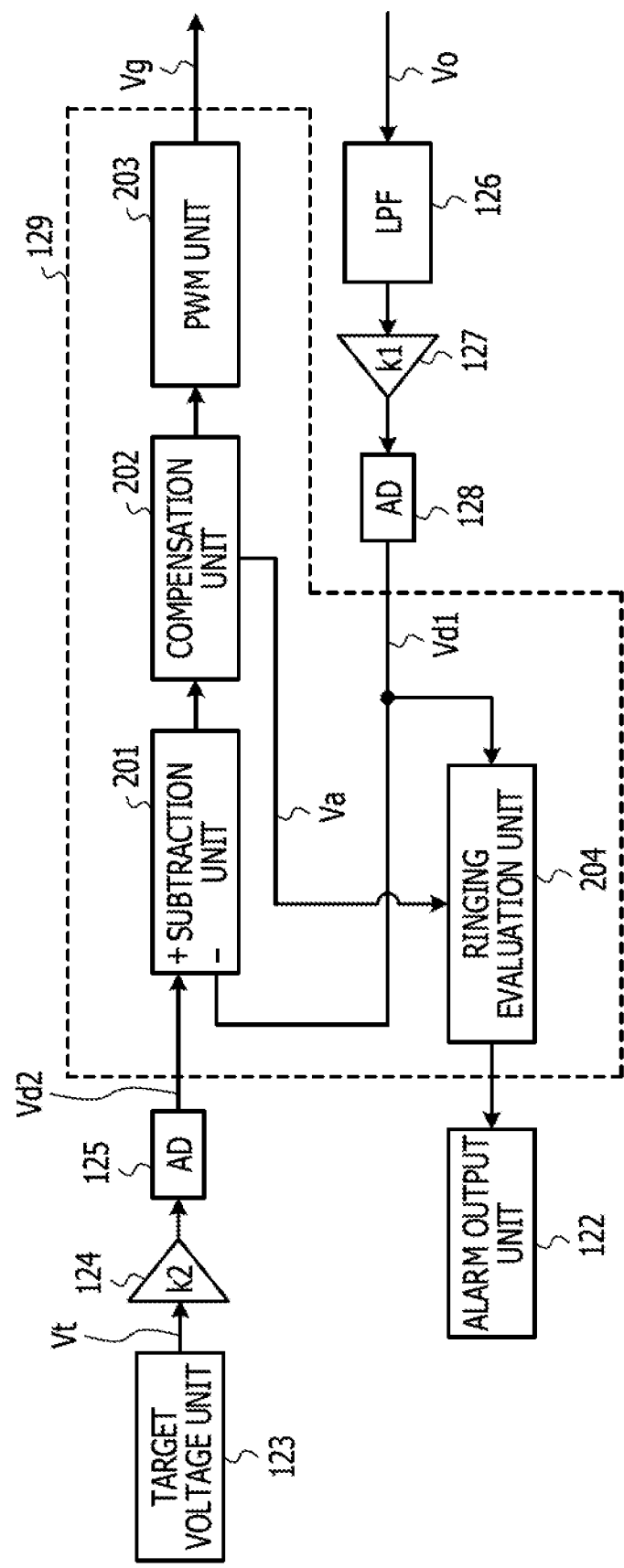
FIG. 2 is a block diagram illustrating functions activated when a microcomputer executes programs.

FIG. 2 is a block diagram illustrating functions activated when the microcomputer 129 executes programs. The microcomputer 129 includes a subtraction unit 201, a compensation unit 202, a pulse width modulation (PWM) unit 203, and a ringing evaluation unit 204 as program modules. The subtraction unit 201 subtracts the digital output voltage Vd1 from the digital target voltage Vd2 and outputs a result of the subtraction. The compensation unit 202 calculates a duty ratio based on an output value of the subtraction unit 201. Hereinafter, the duty ratio will be described with reference to FIG. 3A.

Figure 3A:
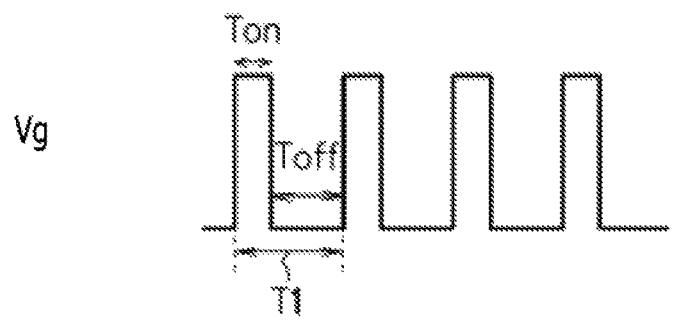
FIG. 3A is a diagram illustrating a waveform of a gate voltage.

FIG. 3A is a diagram illustrating a pulse waveform of the gate voltage Vg of the field effect transistor 112. A period of time T1 is a cycle of the gate voltage Vg and is 10 µs, for example. Specifically, the period of time T1 is a switching cycle of the field effect transistor 112. The period of time T1 is a sum of a high-level time Ton and a low-level time Toff. The field effect transistor 112 is turned on in the high-level time Ton whereas the field effect transistor 112 is turned off in the low-level time Toff. A duty ratio of the gate voltage Vg is Ton/T1. The compensation unit 202 is a duty ratio calculation unit and calculates the duty ratio of the gate voltage Vg. The PWM unit 203 outputs the gate voltage Vg which has been subjected to pulse width modulation based on the duty ratio output from the compensation unit 202 to the gate of the field effect transistor 112. By this, the microcomputer 129 generates the gate voltage Vg such that the digital output voltage Vd1 becomes close to the digital target voltage Vd2. Furthermore, the compensation unit 202 outputs an average output voltage Va which is an average value of output voltages Vo to the ringing evaluation unit 204.

Figure 3B:
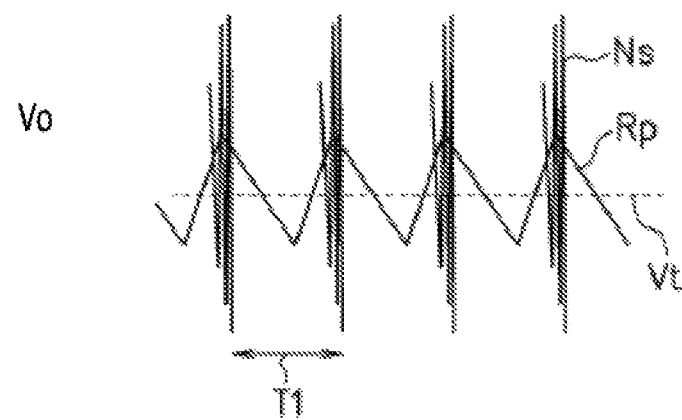
FIGS. 3B, 3D, and 3E are diagrams illustrating waveforms of output voltages.

FIG. 3B is a diagram illustrating a waveform of the output voltage Vo of the electrolytic capacitor 119. The output voltage Vo includes a ripple Rp and a switching noise Ns while a target voltage Vt is set at the center. A cycle T1 of the ripple Rp is the same as the switching cycle T1 of FIG.

3A. The ripple Rp represents noise having a cycle the same as the switching cycle T1 of the field effect transistor 112 which is approximately several tens mV. The switching noise Ns represents noise having a cycle shorter than the switching cycle T1 of the field effect transistor 112 which is approximately several hundreds of mV.

Figure 3C:
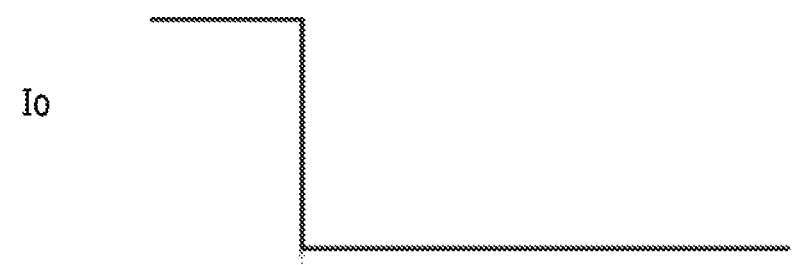
FIG. 3C is a diagram illustrating a waveform of an output current.

FIG. 3C is a diagram illustrating a waveform of an output current Io of the electrolytic capacitor 119 obtained in a case where the load (the server 300) of the electrolytic capacitor 119 rapidly varies. When a load becomes small, the output current Io becomes small.

Figure 3D:
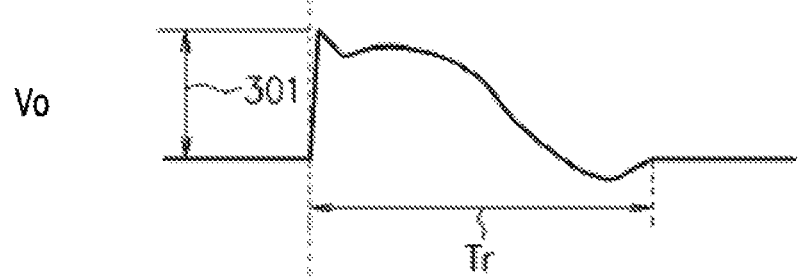

FIG. 3D is a diagram illustrating a waveform obtained when the output voltage Vo of the electrolytic capacitor 119 changes in accordance with the rapid change of the load of FIG. 3C and represents an example of a response of the output voltage Vo when control is stably performed. A response time Tr is 2 ms, for example, which is a period of time until an average of the output voltages Vo becomes stable at the target voltage Vt. When the load rapidly changes, the output voltage Vo also rapidly changes. In this case, the output voltage Vo is converged into the target voltage Vt when the microcomputer 129 controls the gate voltage Vg. A voltage change amount 301 corresponding to the rapid change of the load indicates a largest value of a voltage change when the rapid change of the load occurs.

Figure 3E:
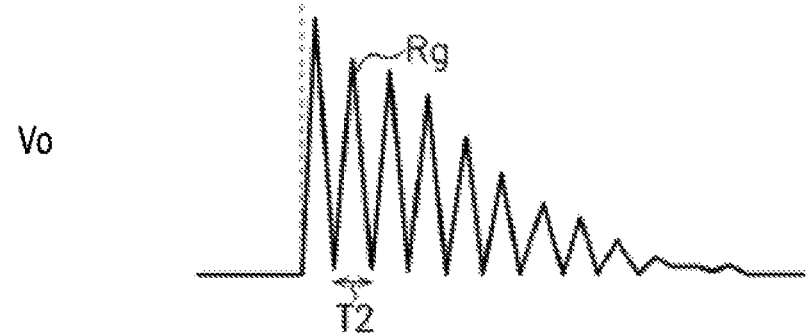

FIG. 3E is a diagram illustrating a waveform indicating a change of the output voltage Vo of the electrolytic capacitor 119 caused by the rapid change of the load of FIG. 3C. In FIG. 3E, a response of the output voltage Vo in a case of unstable control is illustrated. When the control is unstable, the output voltage Vo includes a ringing Rg. The ringing Rg represents noise having a cycle T2 which is longer than the switching cycle T1 of the field effect transistor 112 illustrated in FIG. 3A.

FIG. 4A is a diagram illustrating a configuration of the electrolytic capacitor 119. The electrolytic capacitor 119 includes an anode foil 401, a dielectric body ($Al_2O_3$) 402, an electrolyte 403, electrolytic paper 404, and a cathode foil 405.

FIG. 4B is a diagram illustrating an equivalent circuit of the electrolytic capacitor 119. The electrolytic capacitor 119 includes an inductor 411, a diode 412, a capacitor 413, resistors 414 and 415, a diode 416, a capacitor 417, a resistor 418, and an inductor 419. The resistor 415 is an equivalent series resistance (ESR).

FIG. 4C is a diagram illustrating a capacitance characteristic 421 of the electrolytic capacitor 119 and a resistance characteristic 422 of the ESR 415 and represents a result of a load test under a temperature of 85° C. As the capacitance characteristic 421, a capacitance value of the electrolytic capacitor 119 is reduced since effective areas of the anode foil 401 and the cathode foil 405 are reduced with time due to evaporation of the electrolyte 403. As the resistance characteristic 422 of the ESR 415, a resistance value of the ESR 415 is increased since effective areas of the anode foil 401 and the cathode foil 405 are reduced with time due to the evaporation of the electrolyte 403 and mobility is reduced with time due to a composition change of the electrolyte 403. When the life limit of the electrolytic capacitor 119 is reached, the capacitance value is reduced by several tens % in the capacitance characteristic 421 of the electrolytic capacitor 119 and the resistance value is increased several times in the resistance characteristic 422 of the ESR 415. When the life limit of the electrolytic capacitor 119 is reached, the change of the capacitance characteristic 421 of the electrolytic capacitor 119 is comparatively small whereas the change of the resistance characteristic 422 of the ESR 415 is comparatively large. Accordingly, when the electrolytic capacitor 119 is deteriorated, the change of the resistance characteristic 422 of the ESR 415 is larger than the change of the capacitance characteristic 421 of the electrolytic capacitor 119.

FIGS. 5A to 5C are diagrams illustrating influence of increase of the ESR 415 in a case where the analog-digital converters 125 and 128 are not used and the compensation unit 202 is subjected to analog control. FIG. 5A is a diagram illustrating an equivalent circuit of the output unit of the power source apparatus 100. The electrolytic capacitor 119 includes the ESR 415. A resistance value of the ESR 415 is increased with time. Resistors 501 and 502 and a capacitor 503 correspond to the low-pass filter 126 of FIG. 1. A load resistor 504 corresponds to the server 300 of FIG. 1.

FIG. 5B is a diagram illustrating a characteristic of a gain relative to a frequency of the power source apparatus 100, and FIG. 5C is a diagram illustrating a characteristic of a phase relative to a frequency of the power source apparatus 100. Characteristics 511 to 514 are obtained in different resistance values of the ESR 415. The resistance value of the ESR 415 is increased from the characteristic 511 to the characteristic 514. A gain is 0 in a zero crossing frequency. A frequency f1 is a zero crossing frequency of the characteristic 511. A frequency f2 is a zero crossing frequency of the characteristic 514. The power source apparatus 100 is responsible on a low frequency side relative to the zero crossing frequency and is not responsible on a high frequency side relative to the zero crossing frequency. The field effect transistor 112 has a switching frequency of 100 kHz and a switching cycle T1 of 10 μs. The low-pass filter 126 has a cutoff frequency f3 and attenuates components in frequencies higher than the cutoff frequency f3. As the resistance value of the ESR 415 increases, the gain increases and the zero crossing frequency shifts to the high frequency side. In the characteristic 511 in which the resistance value of the ESR 415 is small, a phase in the zero crossing frequency f1 is approximately −165 degrees which is close to −180 degrees, and therefore, control is unstable. When the phase exceeds −180 degrees, oscillation is generated. On the other hand, in the characteristic 514 in which the resistance value of the ESR 415 is large, a phase in the zero crossing frequency f2 is approximately −90 degrees which is far from −180 degrees, and therefore, control is stable.

FIGS. 6A to 6C are diagrams illustrating influence of increase of the ESR 415 of the power source apparatus 100 illustrated in FIGS. 1 and 2. The power source apparatus 100 includes the analog-digital converters 125 and 128, and the compensation unit 202 is a digital control compensator. FIG. 6A is a diagram illustrating digital control performed by the microcomputer 129. The microcomputer 129 calculates a duty ratio based on a digital output voltage SMP in a first switching cycle (10 μS) and controls a pulse width of the gate voltage Vg in a second switching cycle which follows the first switching cycle at the earliest. Therefore, a wasted time T3 occurs, and a phase in a control frequency delays by 360 degrees (10 μs).

FIG. 6B is a diagram illustrating a characteristic of a gain relative to a frequency of the power source apparatus 100, and FIG. 6C is a diagram illustrating a characteristic of a phase relative to a frequency of the power source apparatus 100. Characteristics 601 to 602 are obtained in different resistance values of the ESR 415. The characteristic 601 is obtained when the resistance value of the ESR 415 is small, and the characteristic 602 is obtained when the resistance value of the ESR 415 is large. A frequency f4 is a zero crossing frequency of the characteristic 601. A frequency f5 is a zero crossing frequency of the characteristic 602. As the resistance value of the ESR 415 increases, the gain is increases and the zero crossing frequency shifts to the high frequency side. In the characteristic 601 in which the resistance value of the ESR 415 is small, a phase in a zero crossing frequency f4 is approximately −90 degrees which is far from −180 degrees, and therefore, control is stable. On the other hand, in the characteristic 602 in which the resistance value of the ESR 415 is large, a phase in a zero crossing frequency f5 is approximately −150 degrees which is close to −180 degrees, and therefore, control is unstable.

The field effect transistor 112 has a switching frequency of 100 kHz and a switching cycle T1 of 10 μs. The low-pass filter 126 has a cutoff frequency f3 and attenuates components in frequencies higher than the cutoff frequency f3. Since the cutoff frequency f3 is lower than the switching frequency (100 hKz), the low-pass filter 126 removes the ripple Rp and the switching noise Ns illustrated in FIG. 3B and allows the ringing Rg in a frequency in a range from the zero crossing frequency to the cutoff frequency f3 to pass (FIG. 3E).

FIGS. 7A to 7D are diagrams illustrating waveforms of the output voltage Vo of the electrolytic capacitor 119, and FIGS. 7E to 7H are diagrams illustrating waveforms of an output voltage of the low-pass filter 126. In FIGS. 7A and 7E, voltages obtained in a case where the resistance value of the ESR 415 is an initial resistance value are illustrated. In FIGS. 7B and 7F, voltages obtained in a case where the resistance value of the ESR 415 is twice the initial resistance value are illustrated. In FIGS. 7C and 7G, voltages obtained in a case where the resistance value of the ESR 415 is third times the initial resistance value are illustrated. In FIGS. 7D and 7H, voltages obtained in a case where the resistance value of the ESR 415 is fourth times the initial resistance value are illustrated.

As illustrated in FIGS. 7A to 7D, the output voltage Vo of the electrolytic capacitor 119 includes the ripple Rp and the switching noise Ns of FIG. 3B and the ringing Rg of FIG. 3E. The low-pass filter 126 removes the ripple Rp and the switching noise Ns and allows the ringing Rg to pass. Consequently, as illustrated in FIGS. 7E to 7H, the output voltage Vo of the low-pass filter 126 does not include the ripple Rp and the switching noise Ns of FIG. 3B but includes the ringing Rg of FIG. 3E. The larger the resistance value of the ESR 415 becomes, the larger the ringing Rg becomes.

As illustrated in FIGS. 7D and 7H, when the resistance value of the ESR 415 becomes four times the initial resistance value, the ringing Rg becomes conspicuous and a voltage is difficult to be converged. However, a spec of variation of the output voltage Vo (12±5%=±600 mV, for example) is satisfied. Note that, if the resistance value of the ESR 415 becomes five times the initial resistance value, the power source apparatus 100 oscillates, the electrolytic capacitor 119 is out of guaranteed specifications and reaches the life limit.

In FIG. 2, since the low-pass filter 126 removes the ripple Rp, the ringing evaluation unit 204 may diagnose the life of the electrolytic capacitor 119 based on the ripple Rp. Therefore, the ringing evaluation unit 204 receives the average output voltage Va from the compensation unit 202, evaluates the ringing Rg in the digital output voltage Vd1, and outputs a signal indicating the life of the electrolytic capacitor 119 to the alarm output unit 122 when the ringing Rg becomes large. The alarm output unit 122 may light an alarm by a light emitting diode (LED), display the alarm in a display, and generates an alarm sound by a speaker. By this, a notification indicating a time for replacement of the power source apparatus 100 may be transmitted before the power source apparatus 100 fails.

Figure 9:
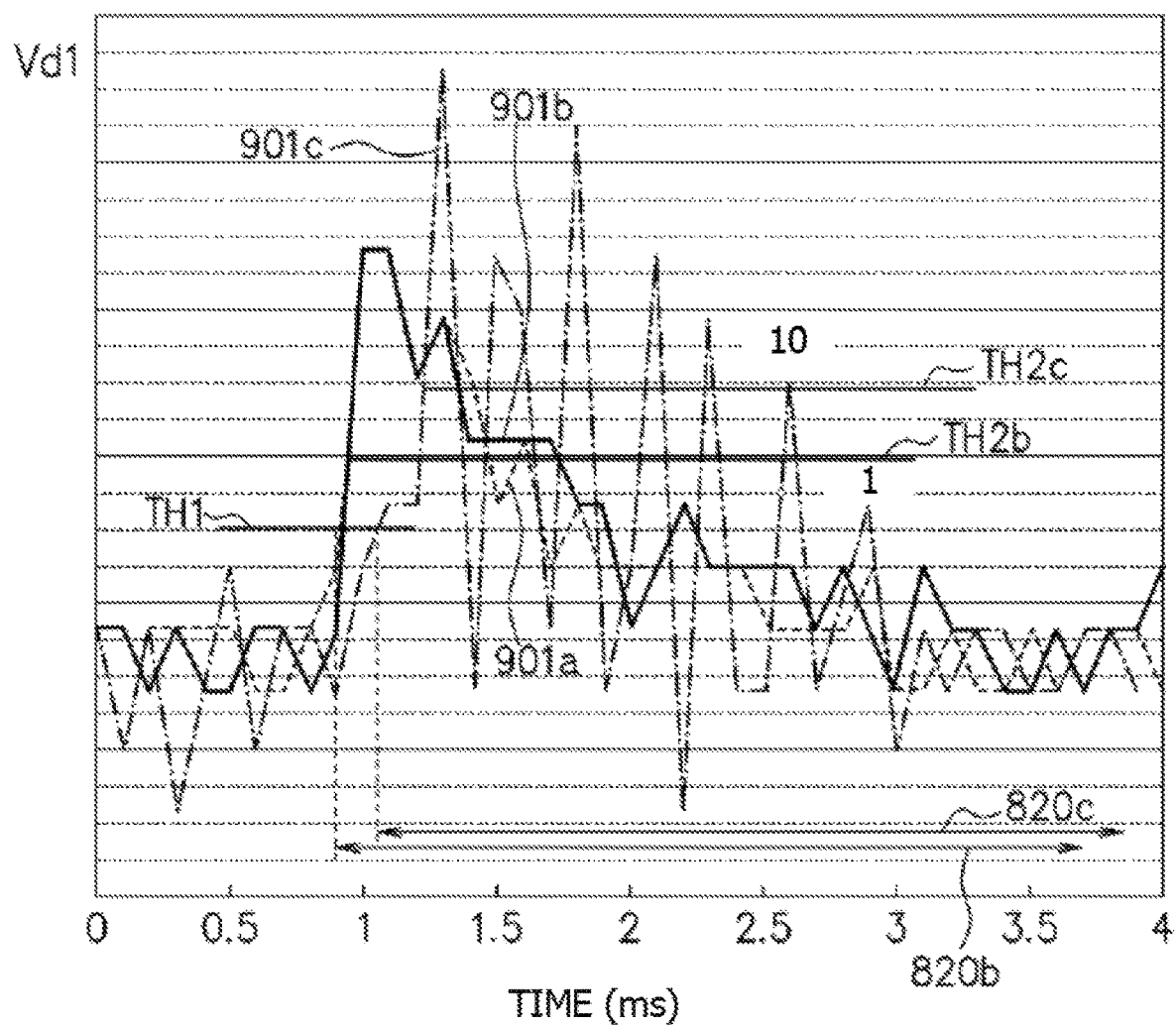
FIG. 9 is a graph illustrating waveforms of digital output voltages.

FIG. 8 is a diagram illustrating the ringing evaluation unit 204 of FIG. 2. FIG. 9 is a graph of waveforms of the digital output voltage Vd1 in a case where an output current Io is changed by −30% due to the load change. A digital output voltage 901a indicates the digital output voltage Vd1 in a case where the resistance value of the ESR 415 is an initial resistance value. A digital output voltage 901b indicates the digital output voltage Vd1 in a case where the resistance value of the ESR 415 is twice the initial resistance value. A digital output voltage 901c indicates the digital output voltage Vd1 in a case where the resistance value of the ESR 415 is four times the initial resistance value.

An average unit 801 obtains an average output voltage Va of a preceding cycle from the compensation unit 202 and outputs the average output voltage Va to a subtraction unit 802. Note that the average unit 801 may calculate an average output voltage Va of the digital output voltages Vo and output the average output voltage Va to the subtraction unit 802. The subtraction unit 802 subtracts the average output voltage Va from the digital output voltage Vd1 and outputs a result of the subtraction to an absolute value unit 803. Note that if a cycle in which the subtraction unit 802 obtains the digital output voltage Vd1 is set to 10 times the switching cycle T1, the process of the ringing evaluation unit 204 may be reduced. Furthermore, the ringing may be detected with high accuracy even if the cycle is set to 10 times the switching cycle T1. The absolute value unit 803 outputs an absolute value of an output value of the subtraction unit 802 as a voltage change ΔV. A comparison unit 804 compares the voltage change ΔV with a first threshold value TH1. When the voltage change ΔV becomes larger than the first threshold value TH1, the average unit 801 obtains an average output voltage Va of a preceding cycle from the compensation unit 202.

Furthermore, when the voltage change ΔV is larger than the first threshold value TH1, a counter 809 resets a counter value, a timer 810 starts counting of a timer value 820, and a largest value detection unit 805 detects a largest value of the voltage change ΔV and outputs the detected largest value to a second threshold value unit 806. For example, the timer 810 starts counting of a timer value 820b in a case of the digital output voltage 901b, and starts counting of a timer value 820c in a case of the digital output voltage 901c. The second threshold value unit 806 outputs a value obtained by multiplying a largest value of the voltage change ΔV by a coefficient (0.5, for example) as a second threshold value TH2. For example, a second threshold value TH2b corresponds to the second threshold value TH2 for the digital output voltage 901b, and a second threshold value TH2c corresponds to the second threshold value TH2 for the digital output voltage 901c.

A comparison unit 807 compares the voltage change ΔV with the second threshold value TH2. An edge detection unit 808 detects a rising edge and a falling edge of the voltage change ΔV at a time when the magnitude relationship between the voltage change ΔV and the second threshold value TH2 is reversed. After the largest value detection unit 805 detects the largest value, the counter 809 counts the number of rising edges and the number of falling edges detected by the edge detection unit 808.

A comparison unit 811 compares the timer value 820 of the timer 810 with a third threshold value TH3. The third threshold value TH3 is a response time. The counter 809 stops the counting when the timer value 820 of the timer 810 becomes larger than the third threshold value TH3. For example, a counter value of the counter 809 is 1 for the digital output voltage 901b, and is 10 for the digital output voltage 901c.

A comparison unit 812 outputs a signal indicating the life of the electrolytic capacitor 119 to the alarm output unit 122 when the counter value of the counter 809 is larger than a fourth threshold value TH4. The fourth threshold value TH4 is 5, for example. The comparison unit 812 outputs a signal indicating that the electrolytic capacitor 119 is not deteriorated since the counter value (1) of the counter 809 for the digital output voltage 901b is smaller than the fourth threshold value TH4 (5). Furthermore, the comparison unit 812 outputs a signal indicating that the electrolytic capacitor 119 is deteriorated since larger than the fourth threshold value TH4 (5). When receiving the signal indicating that the electrolytic capacitor 119 is deteriorated, the alarm output unit 122 transmits a notification indicating that the power source apparatus 100 is to be replaced. In this way, the ringing evaluation unit 204 may diagnose the life of the electrolytic capacitor 119 with high accuracy.

Figure 10A:
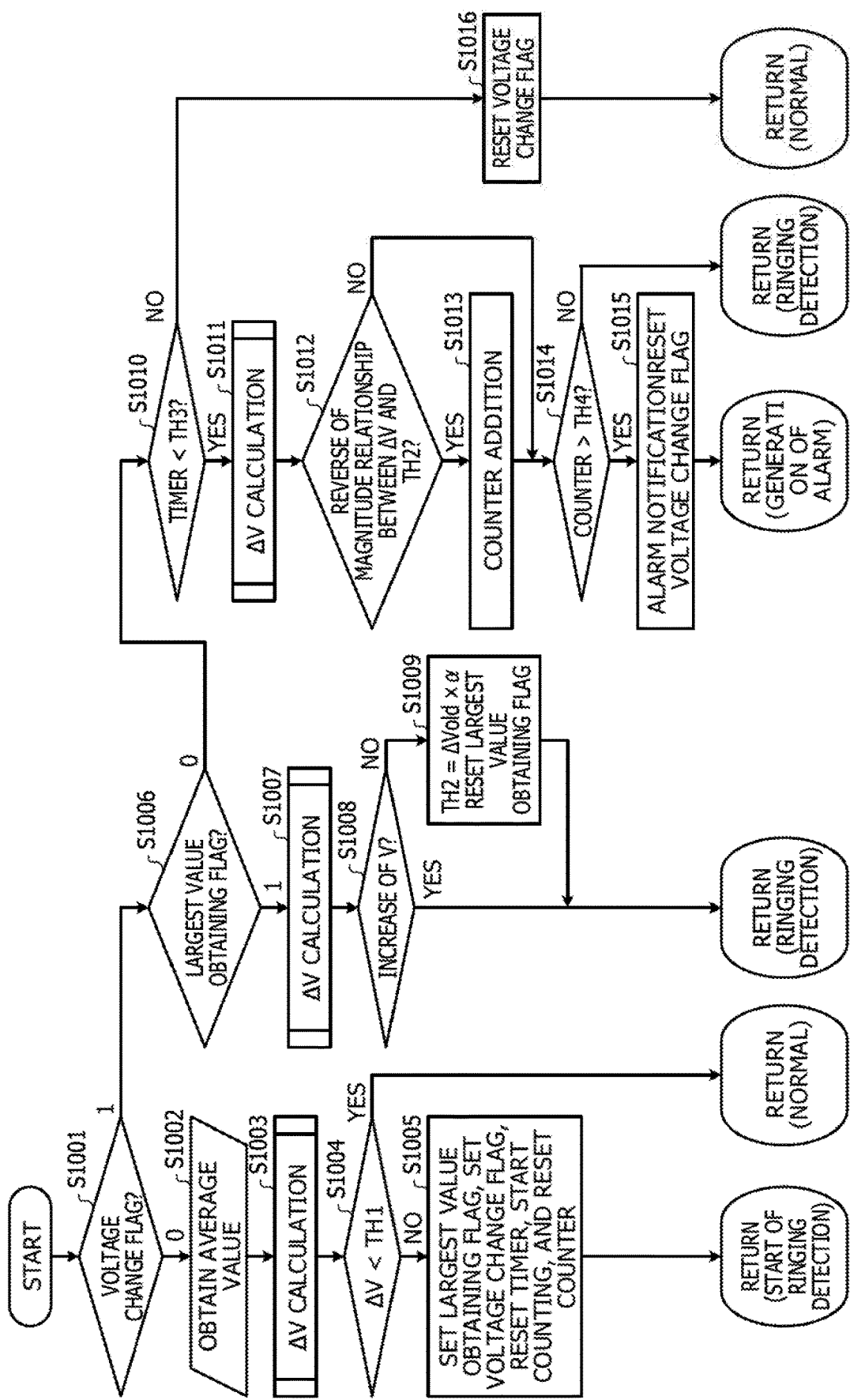
FIGS. 10A and 10B are flowcharts of a process performed by the ringing evaluation unit.

FIG. 10A is a flowchart illustrating a process performed by the ringing evaluation unit 204 which is a capacitor life diagnosis method. In step S1001, the ringing evaluation unit 204 determines a value of a voltage change flag. Here, an initial value of the voltage change flag is 0. When the ringing evaluation unit 204 determines that the value of the voltage change flag is 0, the process proceeds to step S1002. In step S1002, the average unit 801 obtains an average output voltage Va. In step S1003, the subtraction unit 802 and the absolute value unit 803 calculate a voltage change ΔV, and the process proceeds to step S1004.

Figure 10B:
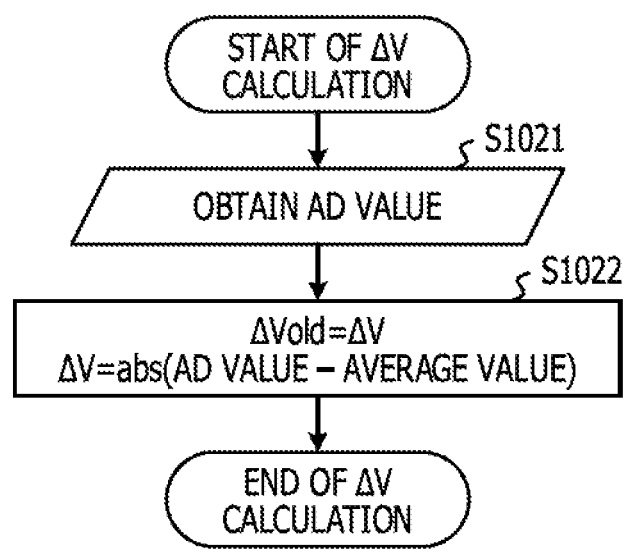

FIG. 10B is a flowchart illustrating a process of calculating the voltage change ΔV performed in step S1003. In step S1021, the subtraction unit 802 obtains a digital output voltage Vd1 from the analog-digital converter 128. In step S1022, the ringing evaluation unit 204 assigns the voltage change ΔV to a variable ΔVold. The subtraction unit 802 subtracts the average output voltage Va from the digital output voltage Vd1. The absolute value unit 803 calculates an absolute value of a result of the subtraction as the voltage change ΔV.

In step S1004 of FIG. 10A, when the voltage change ΔV is smaller than the first threshold value TH1, the comparison unit 804 returns to step S1001. In step S1004, when the voltage change ΔV is equal to or larger than the first threshold value TH1, the comparison unit 804 proceeds to step S1005. In step S1005, the ringing evaluation unit 204 sets 1 to the largest value obtaining flag, sets 1 to a voltage change flag, resets the timer value 820 of the timer 810 to 0, causes the timer 810 to start counting of the timer value 820, and resets the counter value of the counter 809 to 0. Thereafter, the ringing evaluation unit 204 returns to step S1001.

In step S1001, the ringing evaluation unit 204 proceeds to step S1006 since the voltage change flag indicates 1. In step S1006, the ringing evaluation unit 204 proceeds to step S1007 since the largest value obtaining flag indicates 1. In step S1007, the subtraction unit 802 and the absolute value unit 803 calculate the voltage change ΔV by performing the process described above with reference to FIG. 10B. In step S1008, the largest value detection unit 805 returns to step S1001 when the voltage change ΔV is being increased. Thereafter, in step S1008, the largest value detection unit 805 proceeds to step S1009 when the increase of the voltage change ΔV is terminated. In step S1009, the largest value detection unit 805 detects the voltage change ΔVold before the termination of the increase as a largest value. Thereafter, the second threshold value unit 806 multiplies the largest value ΔVold by a coefficient α so as to obtain the second threshold value TH2. The coefficient α is larger than 0 and smaller than 1, and is 0.5, for example. Thereafter, the ringing evaluation unit 204 resets the largest value obtaining flag to 0. Thereafter, the ringing evaluation unit 204 returns to step S1001.

In step S1006, the ringing evaluation unit 204 proceeds to step S1010 since the largest value obtaining flag indicates 0. When the comparison unit 811 determines that the timer value 820 of the timer 810 is smaller than the third threshold value TH3 in step S1010, the process proceeds to step S1011. In step S1011, the subtraction unit 802 and the absolute value unit 803 calculate the voltage change ΔV by performing the process described above with reference to FIG. 10B. In step S1012, the comparison unit 807 determines whether the magnitude relationship between the voltage change ΔV and the second threshold value TH2 has been reversed. When the determination is affirmative, the process proceeds to step S1013, and otherwise, the process proceeds to step S1014. In step S1013, the counter 809 adds 1 to the count value and the process proceeds to step S1014. When the comparison unit 812 determines that the counter value of the counter 809 is equal to or smaller than the fourth threshold value TH4 in step S1014, the process returns to step S1001.

When the comparison unit 812 determines that the counter value of the counter 809 is larger than the fourth threshold value TH4 in step S1014, the process proceeds to step S1015. In step S1015, the comparison unit 812 outputs a signal indicating that the electrolytic capacitor 119 is deteriorated to the alarm output unit 122. Then the alarm output unit 122 generates alarm. The ringing evaluation unit 204 resets the voltage change flag to 0 and process proceeds to step S1001.

When the timer value 820 of the timer 810 is equal to or larger than the third threshold value TH3 in step S1010, the comparison unit 811 proceeds to step S1016. The electrolytic capacitor 119 is not deteriorated in step S1016, and therefore, the ringing evaluation unit 204 resets the voltage change flag to 0 and the process returns to step S1001.

As described above, the processing units 801 to 811 are a ringing detection unit which detects the number of ringings Rg of the digital output voltage Vd1 of the electrolytic capacitor 119 in accordance with change of the output voltage Vo of the electrolytic capacitor 119. Specifically, the counter 809 detects the number of ringings Rg of the digital output voltage Vd1 of the electrolytic capacitor 119 in accordance with the change of the load (the server 300) of the electrolytic capacitor 119. The comparison unit 812 is a generation unit which generates a signal indicating a life of the electrolytic capacitor 119 based on the number of ringings Rg detected by the counter 809. Specifically, the comparison unit 812 generates a signal indicating a life of the electrolytic capacitor 119 when the number of ringings Rg is larger than a fifth threshold value TH5.

The field effect transistor 112 is a switch used to supply electric power to the electrolytic capacitor 119. A cycle of the ringing Rg is longer than the switching cycle T1 of the field effect transistor 112. The low-pass filter 126 attenuates the ripple Rp in the switching cycle T1 of the field effect transistor 112 in the output voltage Vo of the electrolytic capacitor 119. The analog-digital converter 128 converts an analog output voltage of the low-pass filter 126 into a digital output voltage Vd1 and outputs the digital output voltage Vd1.

Second Embodiment

Figure 11:
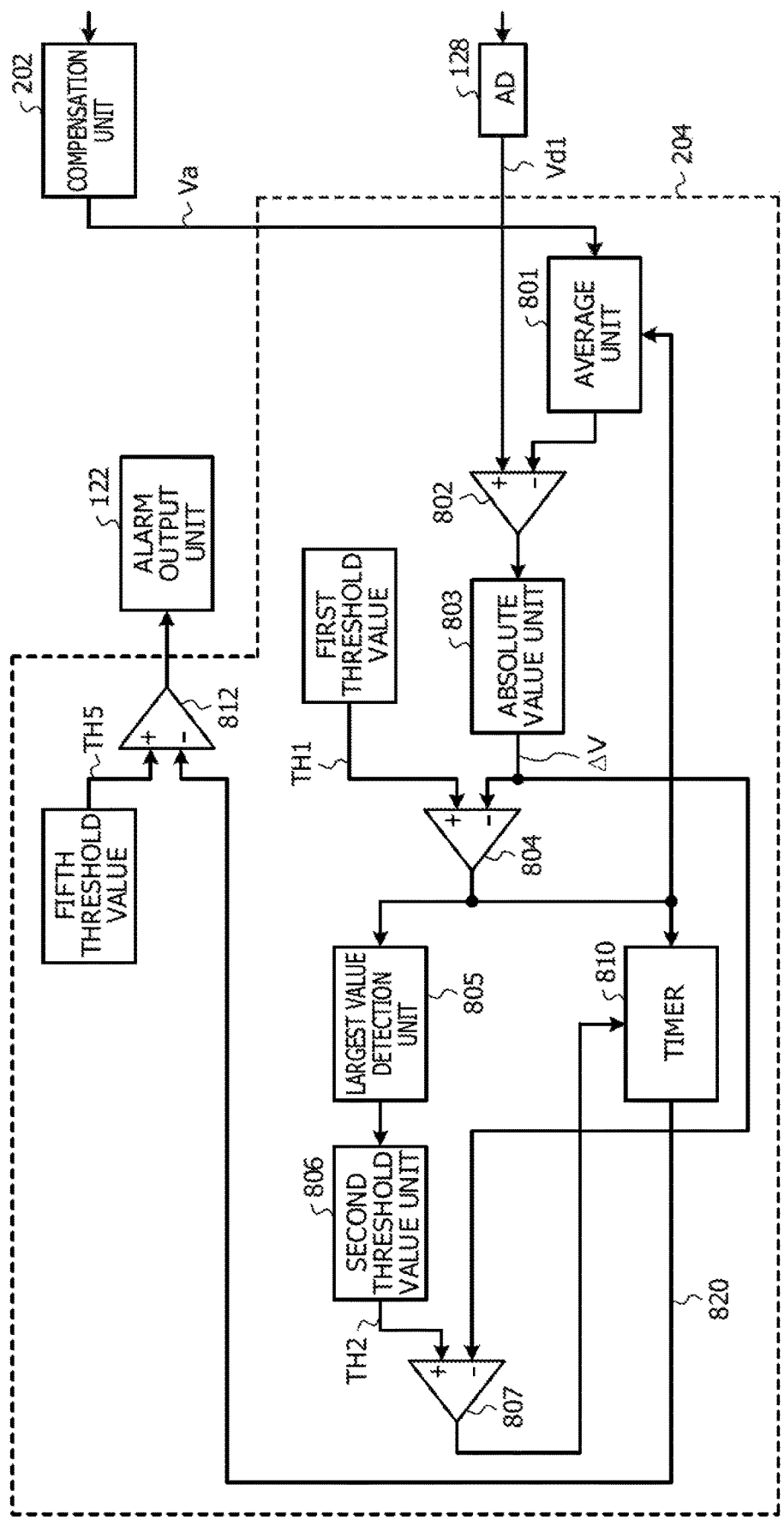
FIG. 11 is a diagram illustrating a ringing evaluation unit according to a second embodiment.

FIG. 11 is a diagram illustrating a ringing evaluation unit 204 (FIG. 2) according to a second embodiment. Unlike the ringing evaluation unit 204 of FIG. 8, the ringing evaluation unit 204 of FIG. 11 does not include the edge detection unit 808, the counter 809, and the comparison unit 811. Hereinafter, portions of the second embodiment different from the first embodiment will be described.

Figure 12:
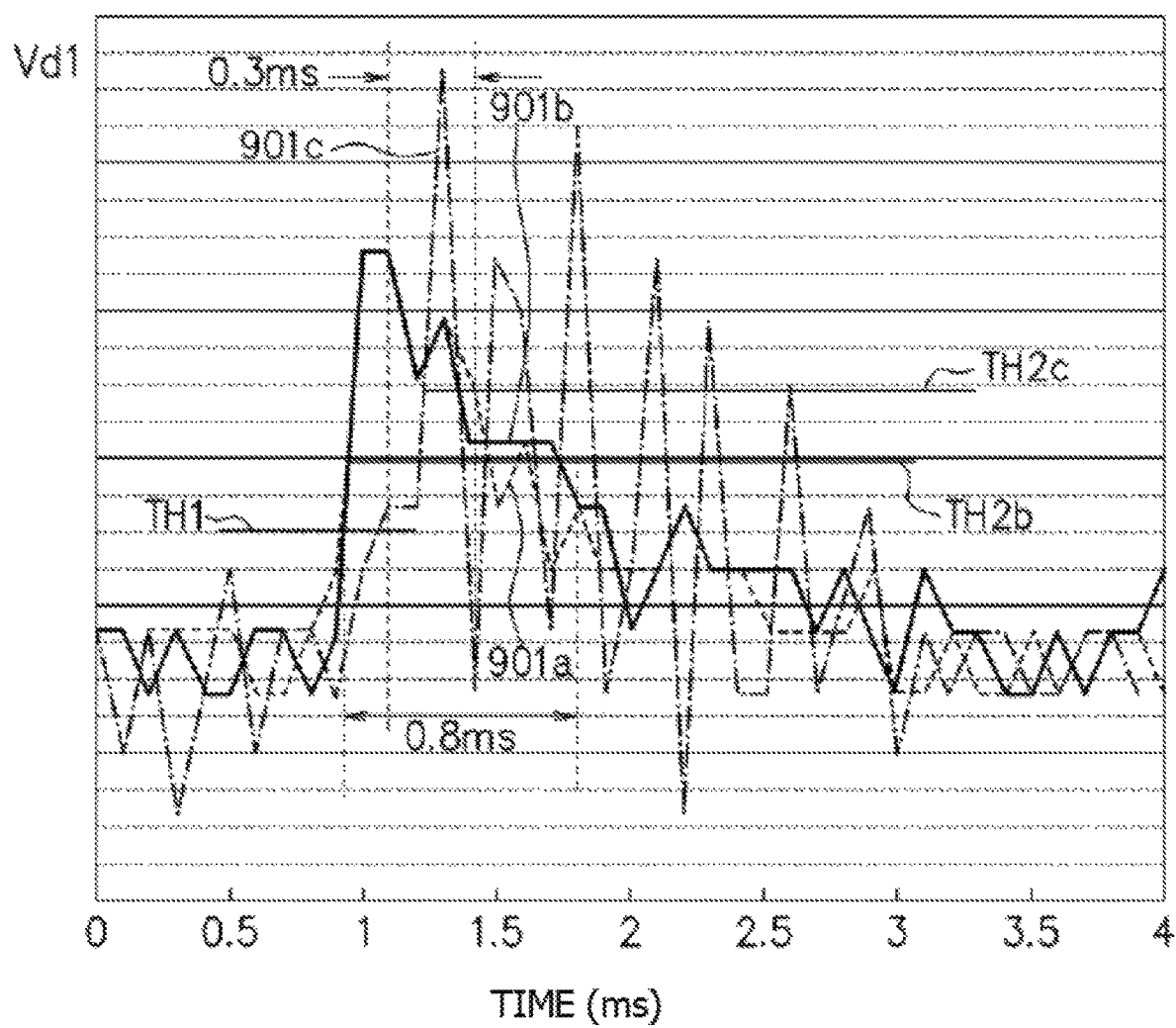
FIG. 12 is a diagram illustrating waveforms of digital output voltages.

FIG. 12 corresponding to FIG. 9 is a graph of waveforms of a digital output voltage Vd1 in a case where an output current Io changed by −30% due to a load change. A timer 810 starts counting of a timer value 820 when a voltage change ΔV becomes larger than a first threshold value TH1 and stops the counting of the timer value 820 when a state in which the voltage change ΔV is larger than a second threshold value TH2 is changed to a state in which the voltage change ΔV is smaller than the second threshold value TH2. For example, the timer value 820 of the timer 810 is 0.8 ms for a digital output voltage 901b, and is 0.3 ms for a digital output voltage 901c.

A comparison unit 812 outputs a signal indicating a life of an electrolytic capacitor 119 to an alarm output unit 122 when the timer value 820 of the timer 810 is smaller than a fifth threshold value TH5. The fifth threshold value TH5 is 0.5, for example. The comparison unit 812 outputs a signal indicating that the electrolytic capacitor 119 is not deteriorated since the timer value 820 (0.8 ms) of the timer 810 for the digital output voltage 901b is larger than the fifth threshold value TH5 (0.5 ms). Furthermore, the comparison unit 812 outputs a signal indicating that the electrolytic capacitor 119 is deteriorated since the timer value 820 (0.3 ms) of the timer 810 for the digital output voltage 901c is smaller than the fifth threshold value TH5 (0.5 ms). When receiving the signal indicating that the electrolytic capacitor 119 is deteriorated, the alarm output unit 122 transmits a notification indicating that the power source apparatus 100 is to be replaced. In this way, the ringing evaluation unit 204 may diagnose the life of the electrolytic capacitor 119 with high accuracy.

Figure 13:
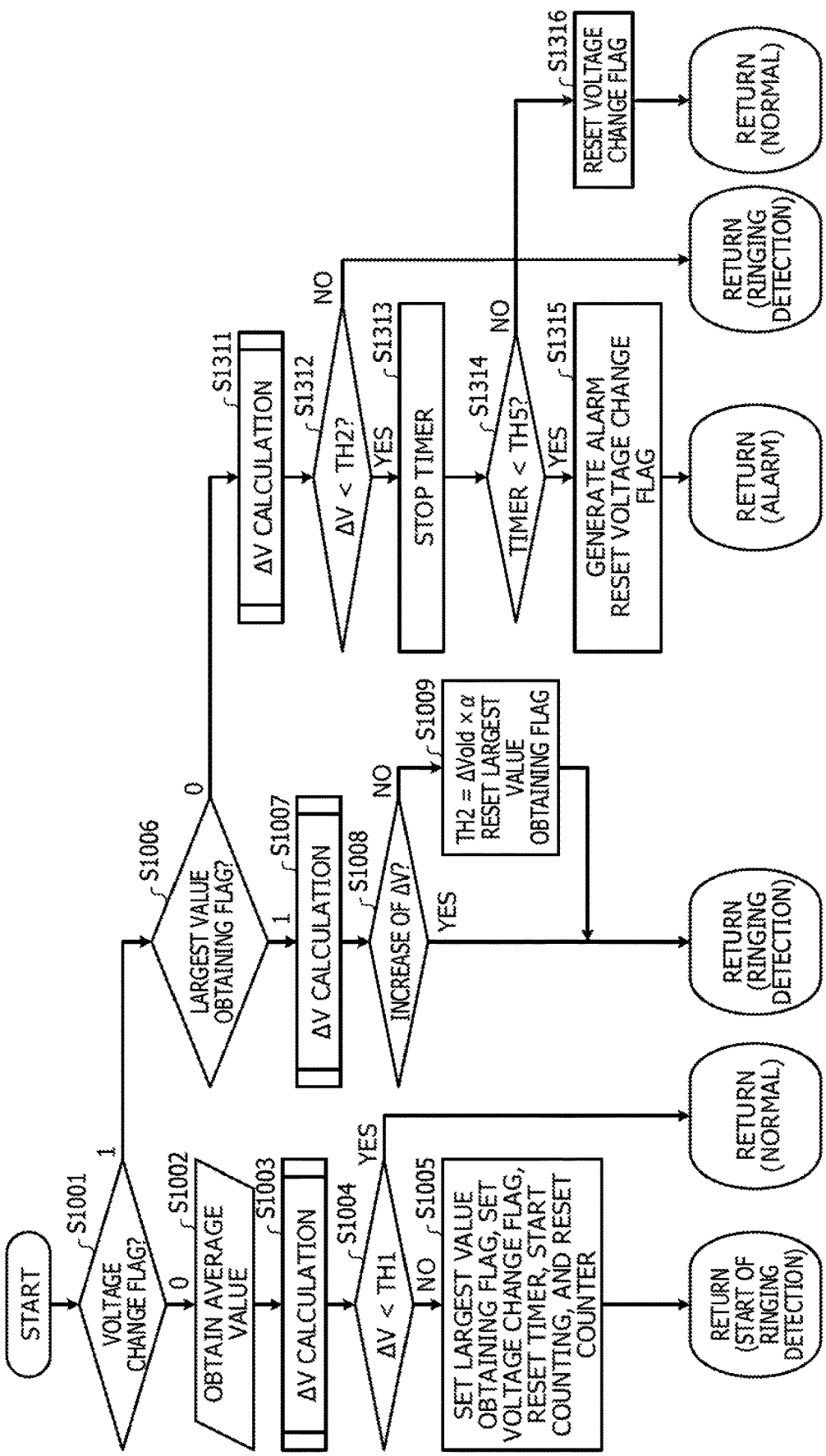
FIG. 13 is a flowchart of a process performed by the ringing evaluation unit.

FIG. 13 is a flowchart illustrating a process performed by the ringing evaluation unit 204 which is a capacitor life diagnosis method. In the flowchart of FIG. 13, step S1305 and step S1311 to step S1316 are included instead of step S1005 and step S1010 to step S1016 in the flowchart of FIG. 10A. Hereinafter, portions of FIG. 13 which are different from FIG. 10A will be described.

In step S1004, when a comparison unit 804 determines that the voltage change ΔV is equal to or larger than the first threshold value TH1, the process proceeds to step S1305. In step S1305, the ringing evaluation unit 204 sets 1 to a largest value obtaining flag, sets 1 to a voltage change flag, resets the timer value 820 of the timer 810 to 0, and causes the timer 810 to start counting of the timer value 820. Thereafter, the ringing evaluation unit 204 returns to step S1001.

In step S1006, the ringing evaluation unit 204 proceeds to step S1311 when the largest value obtaining flag indicates 0. In step S1311, the subtraction unit 802 and the absolute value unit 803 calculates the voltage change ΔV by performing the process described above with reference to FIG. 10B. In step S1312, when the voltage change ΔV is equal to or larger than the second threshold value TH2, the comparison unit 807 proceeds to step S1001. In step S1312, when the voltage change ΔV is smaller than the second threshold value TH2, the comparison unit 807 proceeds to step S1313. In step S1313, the timer 810 stops the counting of the timer value 820.

When the comparison unit 812 determines that the timer value 820 of the timer 810 is equal to or larger than the fifth threshold value TH5 in step S1314, the process proceeds to step S1316. The electrolytic capacitor 119 is not deteriorated in step S1316, and therefore, the ringing evaluation unit 204 resets the voltage change flag to 0 and the process returns to step S1001.

When the comparison unit 812 determines that the timer value 820 of the timer 810 is smaller than the fifth threshold value TH5 in step S1314, the process proceeds to step S1315. In step S1315, the comparison unit 812 outputs a signal indicating that the electrolytic capacitor 119 is deteriorated to the alarm output unit 122. Then the alarm output unit 122 generates alarm. The ringing evaluation unit 204 resets the voltage change flag to 0 and process proceeds to step S1001.

As described above, the processing units 801 to 807 and the processing unit 810 are a ringing detection unit which detects a period of time from when a ringing Rg becomes larger than the first threshold value (a first value) TH1 to when the ringing Rg becomes smaller than the second threshold value (a second value) TH2 based on a largest value of the ringing Rg as the timer value 820. The comparison unit 812 generates a signal indicating the life of the electrolytic capacitor 119 when the timer value 820 of the detected period of time is smaller than the fifth threshold value TH5.

Note that the timer 810 may detect a cycle of the ringing Rg. In this case, the comparison unit 812 generates a signal indicating the life of the electrolytic capacitor 119 when the cycle of ringing Rg is smaller than the fifth threshold value TH5.

Third Embodiment

Figure 14A:
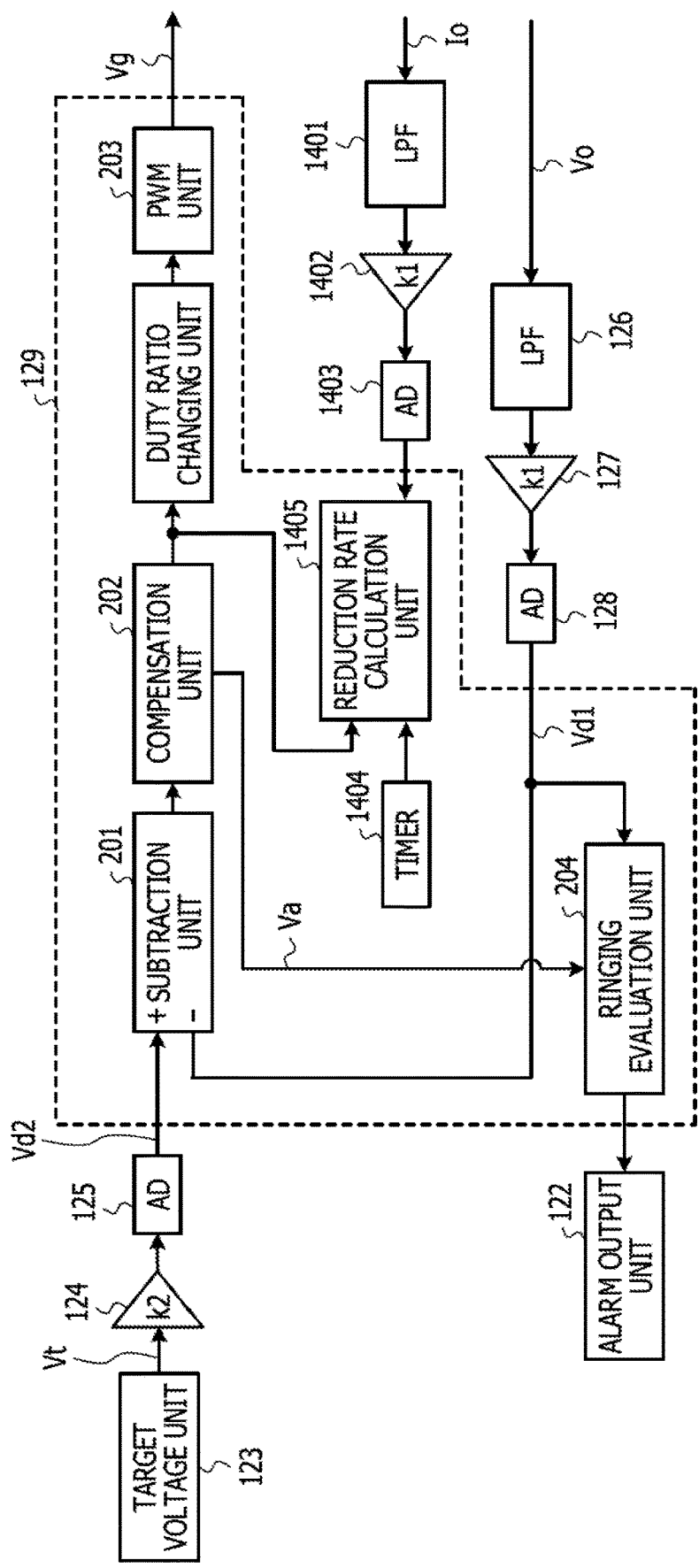
FIGS. 14A and 14B are diagram illustrating a power source apparatus according to a third embodiment.

FIG. 14A is a diagram illustrating a portion of a power source apparatus 100 according to a third embodiment. The power source apparatus 100 of FIG. 14A is constituted by adding a low-pass filter 1401, a gain unit 1402, an analog-digital converter 1403, a timer 1404, a reduction rate calculation unit 1405, and a duty ratio changing unit 1406 to the configuration of the power source apparatus 100 of FIG. 2. The timer 1404, the reduction rate calculation unit 1405, and the duty ratio changing unit 1406 are functions processed when the microcomputer 129 executes programs. Hereinafter, portions of the second embodiment different from the first embodiment will be described.

Figure 14B:

In the first and second embodiments, the ringing evaluation unit 204 evaluates the ringing Rg of the voltage change caused by the rapid change of the load. However, the evaluation of the ringing Rg is difficult in a case of operation at a constant output voltage. In this embodiment, a microcomputer 129 forcibly changes a pulse width (a duty ratio) of a gate voltage Vg of a field effect transistor 112 only by one pulse in a stable operation as illustrated in FIG. 14B so that an output voltage change equivalent to the rapid change of the load occurs. Note that a change amount of the duty ratio is determined based on an output current Io and a duty ratio at the time without departing from requested specifications of a load (a server 300).

The low-pass filter 1401 attenuates frequency components higher than a cutoff frequency in the output voltage Vo detected by a current detection unit 120 of FIG. 1 and outputs the voltage Vo. The gain unit 1402 outputs a current obtained by multiplying an output current of the low-pass filter 1401 by a gain k1. The analog-digital converter 1403 converts an analog output current of the gain unit 1402 into a digital output current to be output to the microcomputer 129.

The reduction rate calculation unit 1405 calculates a reduction rate β of a pulse width of a gate voltage Vg based on the digital output current output from the analog-digital converter 1403 and the duty ratio output from the compensation unit 202. The duty ratio changing unit 1406 changes the duty ratio output from the compensation unit 202 such that the pulse width is reduced by one pulse based on the reduction rate β. A PWM unit 203 outputs a gate voltage Vg having the reduced pulse width by one pulse as illustrated in FIG. 14B based on the duty ratio output from the duty ratio changing unit 1406.

Figure 15A:
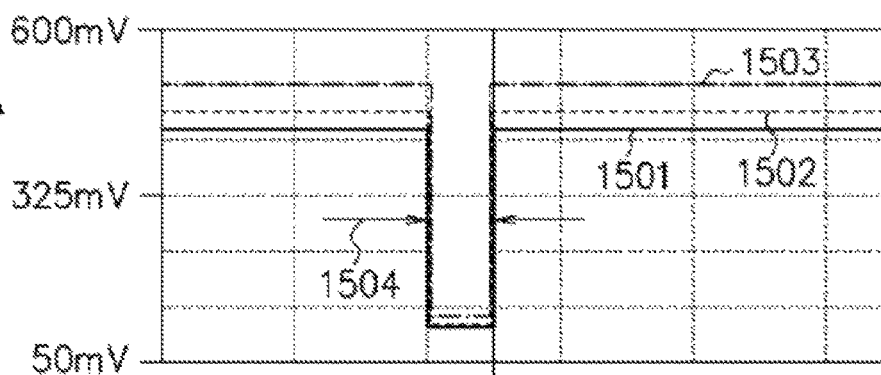
FIG. 15A is a graph illustrating voltages corresponding to duty ratios.

FIG. 15A is a diagram illustrating voltages 1501 to 1503 corresponding to the duty ratio output from the duty ratio changing unit 1406. The voltage 1501 is obtained when an output current Io is 10 A. The voltage 1502 is obtained when the output current Io is 20 A. The voltage 1503 is obtained when the output current Io is 30 A. The duty ratio changing unit 1406 reduces the voltages 1501 to 1503 corresponding to the duty ratio only in a period 1504 so that a reduced pulse width is obtained.

Figure 15B:
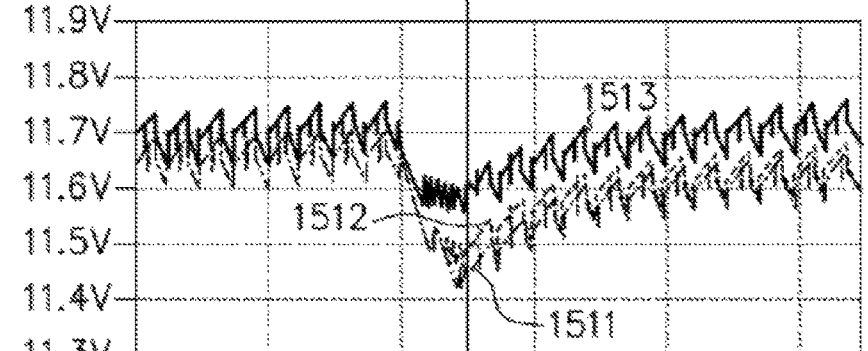
FIG. 15B is a graph illustrating waveforms of output voltages of an electrolytic capacitor.

FIG. 15B is a diagram illustrating waveforms of output voltages 1511 to 1513 of the electrolytic capacitor 119. The voltage 1511 corresponds to the output voltage Vo obtained when the output current Io is 10 A. The voltage 1512 corresponds to the output voltage Vo obtained when the output current Io is 20 A. The voltage 1513 corresponds to the output voltage Vo obtained when the output current Io is 30 A. When the voltages 1501 to 1503 corresponding to the duty ratios illustrated in FIG. 15A are lowered, the output voltages 1511 to 1513 illustrated in FIG. 15B are also lowered. Accordingly, the output voltages 1511 to 1513 vary similarly to the case of the rapid change of the load.

Figure 15C:
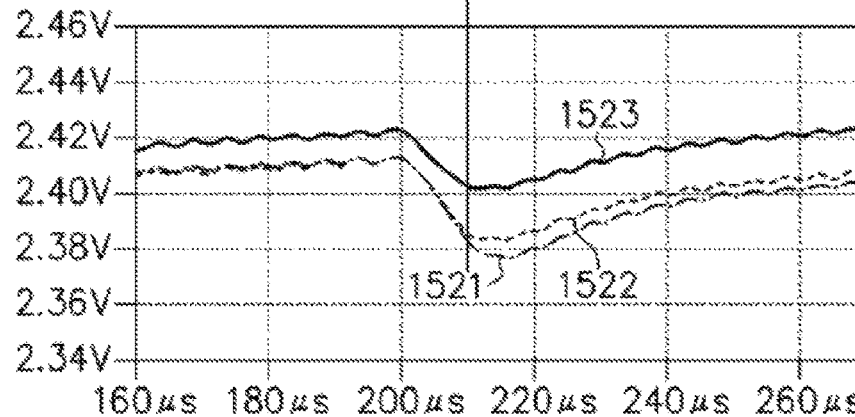
FIG. 15C is a graph illustrating waveforms of voltages output from a low-pass filter.

FIG. 15C is a diagram illustrating waveforms of voltages 1521 to 1523 output from the low-pass filter 126. The voltage 1521 corresponds to an output voltage of the low-pass filter 126 when the output current Io is 10A. The voltage 1522 corresponds to an output voltage of the low-pass filter 126 when the output current Io is 20 A. The voltage 1523 corresponds to an output voltage of the low-pass filter 126 when the output current Io is 30 A. When the voltages 1501 to 1503 corresponding to the duty ratios illustrated in FIG. 15A are lowered, the voltages 1521 to 1523 illustrated in FIG. 15C are also lowered.

Note that the number of pulses in which pulse widths thereof are to be reduced is not limited to 1, but widths of a plurality of successive pulses may be reduced. Furthermore, the pulse widths may be increased instead of the reduction of the pulse widths.

The power source apparatus 100 multiplies the duty ratio by β for n periods so that an output power P1 is reduced to an output power P2. A power change ΔP thereof is represented by Expression 1 below.

$$\Delta P = P1 - P2 = n \times (1-\beta) \times P1 \qquad \text{Expression 1}$$

FIG. 15A to FIG. 15C are diagrams illustrating a case where n is 1 and β is ¼. When n is small, the compensation unit 202 does not respond, and therefore, a current corresponding to a lacked current is extracted from the electrolytic capacitor 119. Furthermore, a voltage change ΔV of the output voltage Vo is represented by Expression 2 below when primary approximation is performed based on a capacitance value C of the electrolytic capacitor 119, a resistance value R of the ESR 415, the output voltage Vo, and the period T1.

$$\Delta V = Vo - \sqrt{[Vo2 - \{(2/C) \times (1-\beta) \times P1 \times n \times T1\}]} + R \times (1-\beta) \times P1/Vo \qquad \text{Expression 2}$$

The deterioration of the electrolytic capacitor 119 may be evaluated without influence on a load (the server 300) by determining the number of pulses n and the reduction rate β so that the voltage change ΔV is included in the specifications of the power source apparatus 100.

Figure 16:
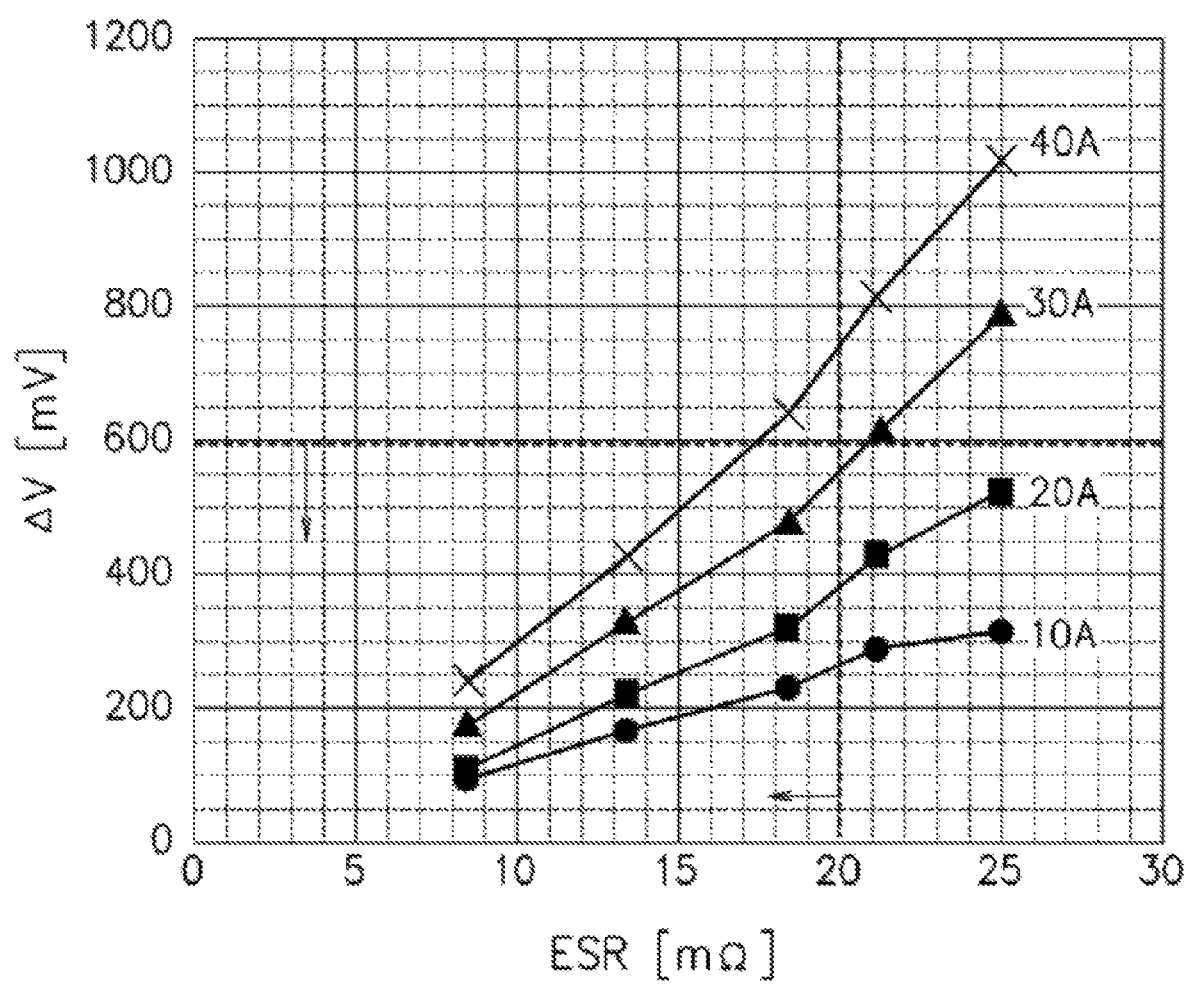
FIG. 16 is a graph illustrating a method for determining a reduction rate.

FIG. 16 is a diagram illustrating a method for determining the reduction rate β and represents the relationship between the voltage change ΔV and the resistance value of the ESR 415 when the output current Io is 10 A, 20 A, 30 A, and 40 A. For example, as the specifications of the power source apparatus 100, an absolute value of the voltage change ΔV is equal to or smaller than 600 mV and the resistance value of the ESR 415 is equal to or smaller than 20 mΩ. The reduction rate β is determined such that the specifications are satisfied. For example, in a case where the output current Io is 20 A, the reduction rate β is determined to a value equal to or larger than ¼. In this case, the duty ratio changing unit 1406 changes the duty ratio of 40% to 10%, for example. Accordingly, the deterioration of the electrolytic capacitor 119 (deterioration of the ESR 415) may be evaluated without influence to the load (the server 300). Furthermore, when the output current Io is larger than 20 A, the larger reduction rate β is set.

Figure 17A:
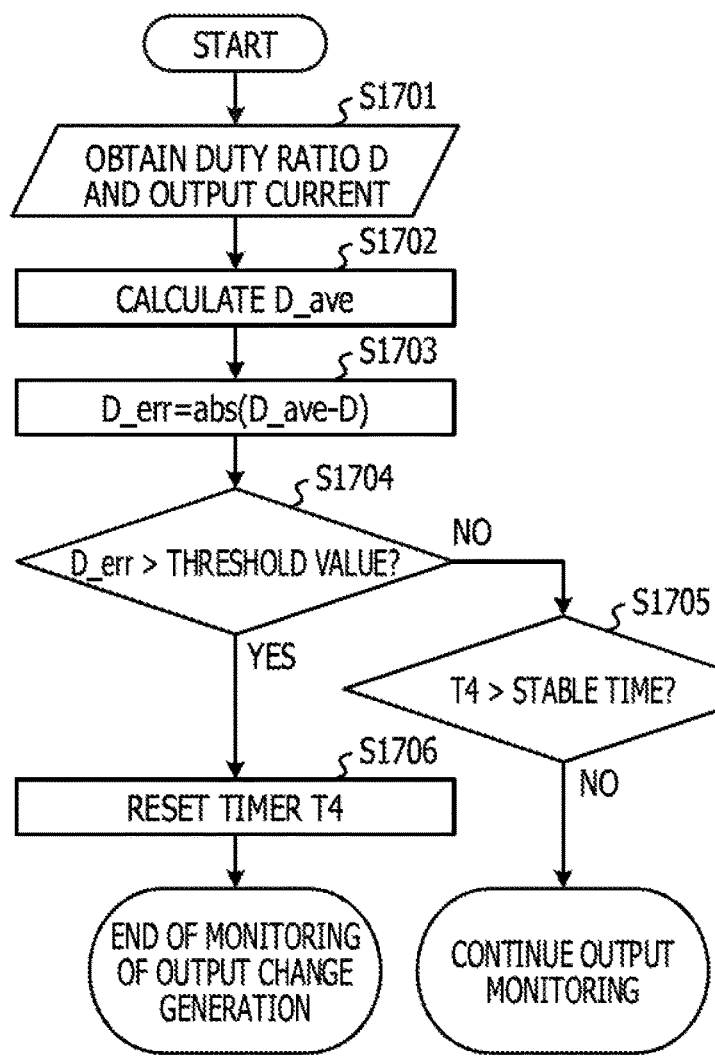
FIGS. 17A and 17B are flowcharts illustrating a process performed by a microcomputer.
Figure 17B:
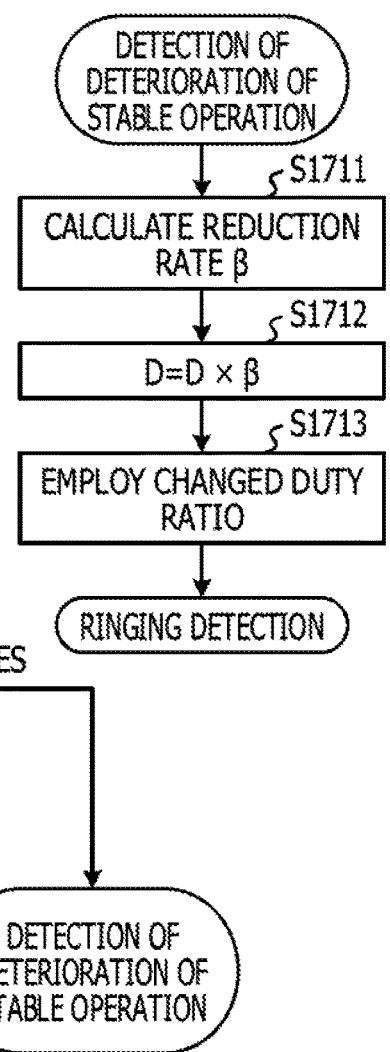

FIGS. 17A and 17B are flowcharts illustrating a process performed by the microcomputer 129. This process is performed once a certain period of time (for example, one day). In step S1701, the reduction rate calculation unit 1405 obtains a duty ratio D from the compensation unit 202 and obtains a digital output current from the analog-digital converter 1403. In step S1702, the reduction rate calculation unit 1405 calculates an average duty ratio D_ave based on the duty ratio D currently obtained. In step S1703, the reduction rate calculation unit 1405 calculates an absolute value of a difference between the average duty ratio D_ave and the duty ratio D as a change D_err. In step S1704, when the reduction rate calculation unit 1405 determines that the change D_err is larger than a threshold value, the process proceeds to step S1705, and when the change D_err is equal to or smaller than the threshold value, the process proceeds to step S1706. In step S1705, the timer 1404 resets a timer value T4 to 0 and starts counting of the timer value T4. Thereafter, since the voltage change ΔV of the output voltage Vo is large, the reduction rate calculation unit 1405 terminates the process without determining the reduction rate β. By this, a pulse width may be reduced when the change of the output voltage Vo is large so that the absolute value of the voltage change ΔV does not exceed 600 mV defined as the specification.

In step S1706, when the reduction rate calculation unit 1405 determines that the timer value T4 is equal to or smaller than a stable time, a change of the output voltage Vo is not stable, and therefore, the process returns to step S1701 so that the process described above is performed again. When the reduction rate calculation unit 1405 determines that the timer value T4 is larger than the stable time, a change of the output voltage Vo is stable, and therefore, the process proceeds to step S1711.

In step S1711, the reduction rate calculation unit 1405 calculates the reduction rate β which satisfies the specifications based on the duty ratio obtained from the compensation unit 202 and the digital output current obtained from the analog-digital converter 1403. In step S1712, the duty ratio changing unit 1406 multiplies the duty ratio D by the reduction rate β and changes a duty ratio for n pulses. In step S1713, the PWM unit 203 outputs a gate voltage Vg in which a pulse width is reduced for n pulses based on the duty ratio changed by the duty ratio changing unit 1406. By this, the output voltage Vo is changed, and therefore, as with the first and second embodiments, the ringing evaluation unit 204 evaluates the deterioration of the electrolytic capacitor 119.

As described above, the compensation unit 202 is a duty ratio calculation unit which calculates a duty ratio of a gate voltage (a control pulse) of the field effect transistor 112 such that a digital output voltage Vd1 of the electrolytic capacitor 119 becomes close to the digital target voltage (a target value) Vd2. The duty ratio changing unit 1406 and the PWM unit 203 are a pulse generation unit which changes the duty ratio calculated by the compensation unit 202 by one pulse or a plurality of pulses and generates a gate voltage Vg of the field effect transistor 112 based on the changed duty ratio. The ringing evaluation unit 204 detects a ringing Rg of the digital output voltage Vd1 of the electrolytic capacitor 119 caused by the change of the duty ratio described above.

Fourth Embodiment

Figure 18:
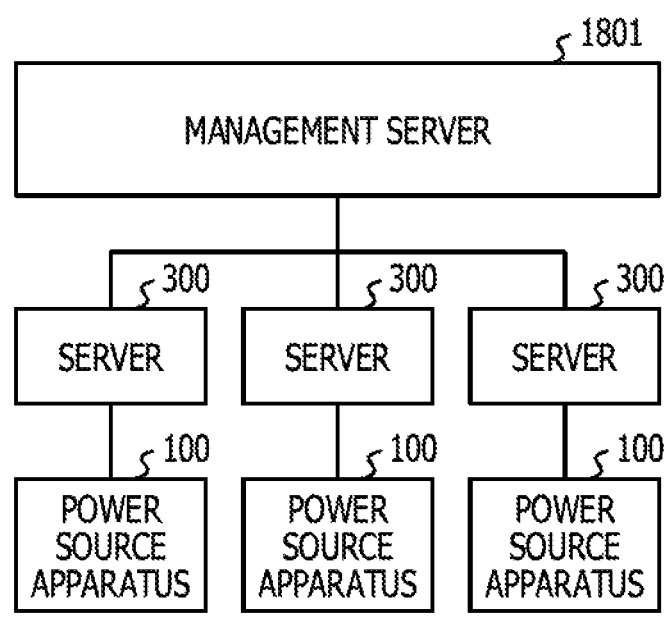
FIG. 18 is a diagram illustrating a configuration of a power source system according to a fourth embodiment.

FIG. 18 is a diagram illustrating a configuration of a power source system according to a fourth embodiment. The power source system includes a management server 1801, a plurality of servers 300, and a plurality of power source apparatuses 100. The power source apparatuses 100 and the servers 300 are the same as those of the first to third embodiments. The power source apparatuses 100 are connected to the respective servers 300. The management server 1801 receives signals indicating deterioration of the electrolytic capacitors 119 of the power source apparatuses 100 through the respective servers 300 and controls the power source apparatuses 100 in accordance with the signals.

As illustrated in FIG. 6B, a characteristic 601 is obtained when the electrolytic capacitor 119 (an ESR 415) is not deteriorated and a gain is comparatively small. On the other hand, a characteristic 602 is obtained when the electrolytic capacitor 119 (the ESR 415) is deteriorated, and a gain is comparatively large. Accordingly, when the electrolytic capacitor 119 is deteriorated, and therefore, a large gain is obtained, a life of the electrolytic capacitor 119 may be extended by reducing the gain and a ringing Rg by delaying a response time of a compensation unit 202. Here, when receiving a signal indicating deterioration of the electrolytic capacitor 119 of one of the power source apparatuses 100, the management server 1801 changes a parameter of the compensation unit 202 of the power source apparatus 100. In this way, a response time of the compensation unit 202 is delayed and the ringing Rg is reduced so that the life of the power source apparatus 100 (the electrolytic capacitor 119) is extended. The management server 1801 changes the parameter of the compensation unit 202 in accordance with the number of ringings Rg output from a counter 809 of FIG. 8 or a timer value 820 of a timer 810 of FIG. 11 with reference to a table of the parameter of the compensation unit 202 relative to a resistance value of the ESR 415. When the gain and the ringing Rg are increased due to the deterioration of the electrolytic capacitor 119, the management server 1801 generates an alarm and gradually reduces the gain of the compensation unit 202 so that the life of the power source apparatus 100 is extended until next periodic maintenance.

FIG. 19A is a flowchart of a process performed by the management server 1801, and FIG. 19B is a flowchart of a process performed by each of the power source apparatuses 100. In step S1911, when the electrolytic capacitor 119 (the ESR 415) is deteriorated, the power source apparatus 100 proceeds to step S1912, and otherwise, the power source apparatus 100 terminates the process in FIG. 19B. In step S1912, the power source apparatus 100 transmits alarm information indicating the deterioration of the electrolytic capacitor 119 to the management server 1801.

In step S1901, the management server 1801 receives and obtains the alarm information from the power source apparatus 100. In step S1902, the management server 1801 determines whether the alarm has been generated in accordance with the alarm information. When the determination is negative, the management server 1801 terminates the process in FIG. 19A, and otherwise, the process proceeds to step S1903. In step S1903, the management server 1801 performs a notification by the alarm in display or by sound. In step S1904, the management server 1801 transmits a signal for switching the parameter of the compensation unit 202 to reduce the gain to the power source apparatus 100.

In step S1913, the power source apparatus 100 receives and obtains the parameter switching signal. In step S1914, the power source apparatus 100 changes the parameter of the compensation unit 202. By this, the gain of the power source apparatus 100 is reduced and the ringing Rg is reduced so that the life of the power source apparatus 100 is extended.

As described above, the compensation unit 202 calculates a duty ratio of a gate voltage Vg of the field effect transistor 112 such that a digital output voltage Vd1 of the electrolytic capacitor 119 becomes close to the digital target voltage Vd2. A PWM unit 203 is a pulse generation unit which generates the gate voltage Vg of the field effect transistor 112 based on the duty ratio obtained by the compensation unit 202. The management server 1801 is a controller which controls the compensation unit 202 such that a response time of the compensation unit 202 delays when the signal indicating the life of the electrolytic capacitor 119 is generated. By this, the life of the electrolytic capacitor 119 may be extended.

Fifth Embodiment

FIG. 20A is a diagram illustrating a configuration of a power source system according to a fifth embodiment. The power source system includes a management server 1801 and a server group 2001. The server group 2001 includes a plurality of power source apparatuses 100a to 100d and a plurality of servers 300a to 300d. The power source apparatuses 100a to 100d corresponding to the power source apparatus 100 of FIG. 1 supply power source voltages to the respective servers 300a to 300d. The management server 1801 assigns a plurality of virtual machines VM to each of the servers 300a to 300d.

Each of the power source apparatuses 100a to 100d transmits the number of ringings Rg output from a counter 809 of FIG. 8 or a timer value 820 of a timer 810 of FIG. 11 to the management server 1801 as a signal indicating a remaining life. As the number of ringings Rg is larger, the remaining life of the power source apparatus 100 is shorter, and as the timer value 820 is smaller, the remaining life of the power source apparatus 100 is shorter. The management server 1801 assigns a plurality of virtual machines VM to each of the servers 300a to 300d in accordance with the signal indicating the remaining life of a corresponding one of the power source apparatuses 100a to 100d.

In FIG. 20A, assignment of the virtual machines VM to the servers 300a to 300d of heavy loads performed by the management server 1801 is illustrated. After the state of FIG. 20A, when the heavy loads are changed to light loads, the management server 1801 assigns the virtual machines VM again to the servers 300a to 300d for reduction of power consumption as illustrated in FIG. 20B. Here, the management server 1801 reduces the number of virtual machines VM to be assigned to the server 300d to which a power source voltage is supplied from the power source apparatus 100d which has a short remaining life in the power source apparatuses 100 from 3 to 2. Specifically, the management server 1801 preferentially assigns the virtual machines VM to the servers 300a to 300c to which power source voltages are supplied from the power source apparatuses 100a to 100c which have longer remaining lives relative to the server 300d to which a power source voltage is supplied from the power source apparatus 100d which has a short life. By this, use frequency of the server 300d corresponding to the power source apparatus 100d having low reliability may be reduced. Then use frequency of the power source apparatus 100d may be reduced, and a speed of reduction of the remaining life of the power source apparatus 100d may be reduced. Accordingly, the remaining lives of the power source apparatuses 100a to 100d may be leveled and replacement cost of the power source apparatuses 100 may be reduced.

After the state of FIG. 20B, when the light loads are changed to heavy loads, the management server 1801 assigns the virtual machines VM again to the servers 300a to 300d for reduction of power consumption as illustrated in FIG. 20C. Here, the management server 1801 reduces the number of virtual machines VM in the server 300d to which a power source voltage is supplied from the power source apparatus 100d which has a short life in the power source apparatuses 100 from 2 to 0. Specifically, the management server 1801 preferentially assigns the virtual machines VM to the servers 300a to 300c to which power source voltages are supplied from the power source apparatuses 100a to 100c which have longer remaining lives relative to the server 300d to which a power source voltage is supplied from the power source apparatus 100d which has a shorter remaining life. When the number of virtual machines VM assigned to the server 300d is 0, the power source apparatus 100d and the server 300d are brought into a stop state, and replacement of the power source apparatus 100d having a short remaining life becomes available.

As described above, according to this embodiment, since the virtual machines VM are preferentially assigned to the servers 300a to 300c corresponding to the power source apparatuses 100a to 100c having the longer remaining lives, the remaining lives of the power source apparatuses 100a to 100d are leveled, and the replacement cost of the power source apparatus may be reduced.

Furthermore, by repeatedly performing the re-assignment of the virtual machines VM for a long period of time, frequency of a stop state of the server 300d corresponding to the power source apparatus 100d having a short remaining life and a high maintenance preferential level is increased, and therefore, movement of the virtual machines VM and stop of the server 300d are not to be performed. Accordingly, maintenance cost may be reduced.

Furthermore, for users who use the servers 300a to 300d as a data center, a possibility of failure of the power source apparatuses 100a and 100b corresponding to the servers 300a and 300b including the virtual machines VM being operated may be reduced, and reliability may be increased. Furthermore, virtual machines VM of a user who pays a lot taking reliability into consideration may be preferentially assigned to the servers 300a to 300c corresponding to the power source apparatuses 100a to 100c having the long remaining life. Furthermore, virtual machines VM of a user who allows a temporary stop of the virtual machines VM are assigned to the server 300d corresponding to the power source apparatus 100d having the short remaining life taking the cost into consideration, and therefore, excessive redundant is removed and improvement of profit and loss in the entire data center is attained.

Figure 21C:
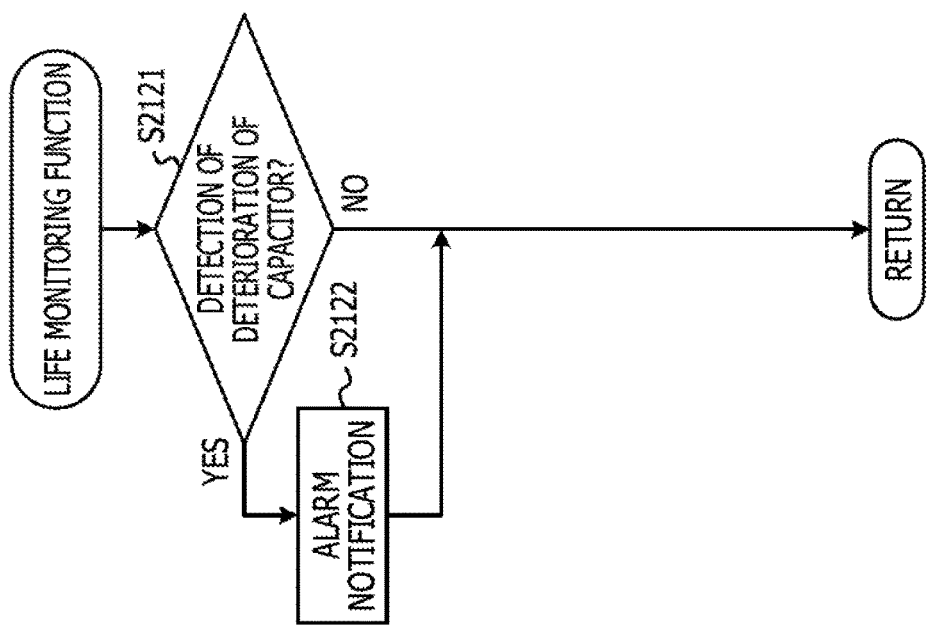
FIG. 21C is a flowchart of a process performed by the power source apparatus.
Figure 21B:
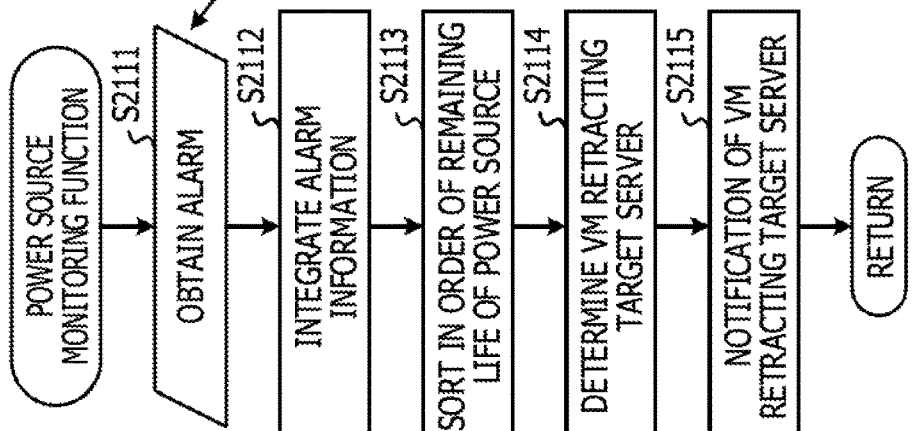
FIG. 21B is a flowchart of a process performed by the management server.
Figure 21A:
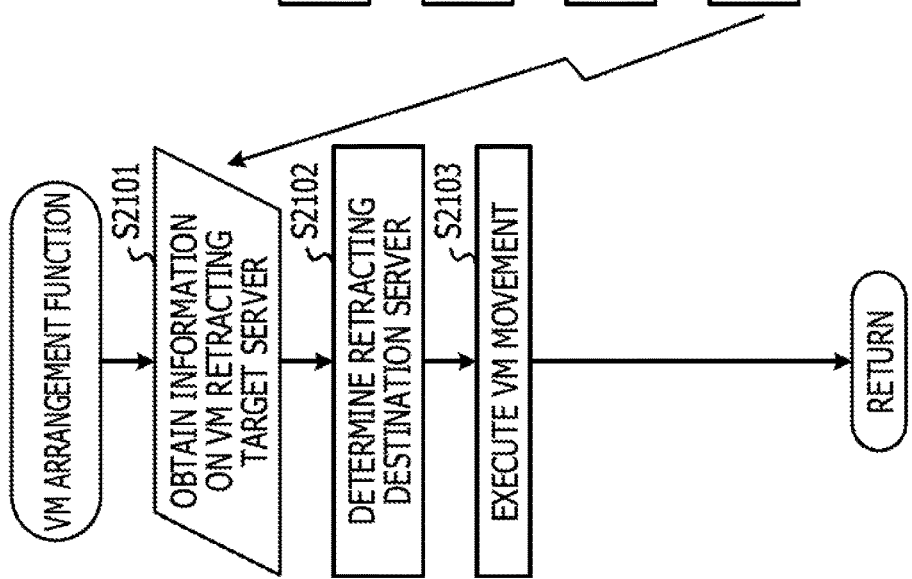
FIG. 21A is a flowchart of a process performed by a server.

FIG. 21A is a flowchart of a process of the servers 300a to 300d, FIG. 21B is a flowchart of a process of the management server 1801, and FIG. 21C is a flowchart of a process of the power source apparatuses 100a to 100d. In step S2121, when each of the power source apparatuses 100a to 100d detects deterioration of the corresponding electrolytic capacitor 119 (the ESR 415), the process proceed to step S2122, and otherwise, the process in FIG. 21C is terminated. In step S2122, each of the power source apparatuses 100a to 100d transmits alarm information indicating the remaining life of the electrolytic capacitor 119 to the management server 1801.

In step S2111, the management server 1801 receives and obtains the alarm information from the power source apparatuses 100a to 100d. In step S2112, the management server 1801 integrates the obtained alarm information of the power source apparatuses 100a to 100d. In step S2113, the management server 1801 sorts the power source apparatuses 100a to 100d in order of remaining life based on the alarm information of the power source apparatuses 100a to 100d. In step S2114, the management server 1801 determines the server 300d corresponding to the power source apparatus 100d having the short remaining life as a virtual machine retracting target server. In step S2115, the management server 1801 transmits information on the virtual machine retracting target server to the servers 300a to 300d.

In step S2101, virtual machine hypervisors included in the servers 300a to 300d receive and obtain the information on the virtual machine retracting target server. In step S2102, the virtual machine hypervisors included in the servers 300a to 300d determine a server having a long remaining life as a retracting destination server based on the information on the virtual machine retracting target server. In step S2103, the virtual machine hypervisors included in the servers 300a to 300d move the virtual machines VM from the virtual machine retracting target server to the retracting destination server. By this, use frequency of the power source apparatus 100d having the short remaining life is reduced, and a speed of reduction of the remaining life of the power source apparatus 100d may be reduced. Note that the process in FIG. 21A may be performed by the management server 1801.

As described above, the electrolytic capacitors 119 of the power source apparatuses 100a to 100d supply power source voltages to the servers 300a to 300d. Numbers of virtual machines VM corresponding to the signals indicating the lives of the electrolytic capacitors 119 may be assigned to the servers 300a to 300d under control of the management server 1801. The number of virtual machines VM assigned to the server 300 corresponding to the power source apparatus 100 having a short remaining life is small or 0, and the number of virtual machines VM assigned to the server 300 corresponding to the power source apparatus 100 having a long remaining life is larger.

Sixth Embodiment

FIG. 22A is a diagram illustrating a configuration of a power source system according to a sixth embodiment. The power source system includes a management server 1801, a power source apparatus 100a, a server 300a, a power source apparatus 100b, and a server 300b. The power source apparatuses 100a and 100b corresponding to the power source apparatus 100 of FIG. 1 supply power source voltages to the respective servers 300a and 300b, respectively. The management server 1801 assigns a plurality of virtual machines VM to each of the servers 300a and 300b.

Each of the power source apparatuses 100a and 100b transmits the number of ringings Rg output from a counter 809 of FIG. 8 or a timer value 820 of a timer 810 of FIG. 11 to the management server 1801 as a signal indicating a remaining life. The management server 1801 assigns a plurality of virtual machines to each of the servers 300a and 300b in accordance with the signals indicating the remaining lives of the power source apparatuses 100a and 100b.

As illustrated in FIG. 22A, the management server 1801 assigns the virtual machines VM to the servers 300a and 300b. For example, the power source apparatus 100a transmits a signal indicating a long remaining life to the management server 1801. The power source apparatus 100b transmits a signal indicating a short remaining life to the management server 1801. Then the management server 1801 assigns the virtual machines VM of a small load change to the server 300b corresponding to the power source apparatus 100b having the short remaining life and assigns the virtual machines VM of a large load change to the server 300a corresponding to the power source apparatus 100a having the long remaining life as illustrated in FIG. 22B. By collectively assigning the virtual machines VM of the small load change to the server 300v corresponding to the power source apparatus 100b having the short remaining life, a speed of reduction of the remaining life of the power source apparatus 100b may be reduced, the remaining lives of the power source apparatuses 100a and 100b may be leveled, and the number of times maintenance is performed may be reduced. Note that the virtual machines VM may be jobs.

Figure 23C:
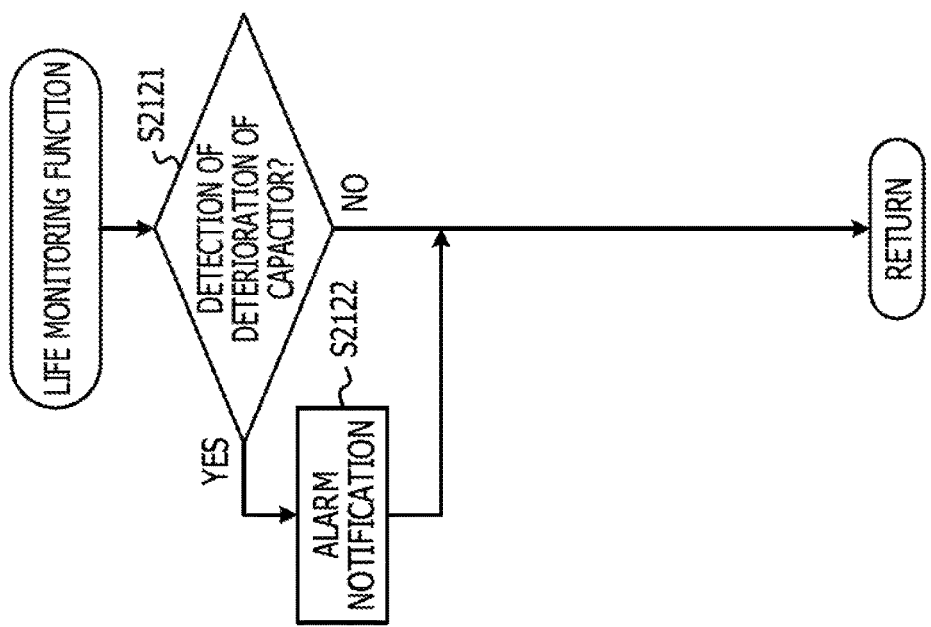
FIG. 23C is a flowchart of a process performed by a power source apparatus.
Figure 23B:
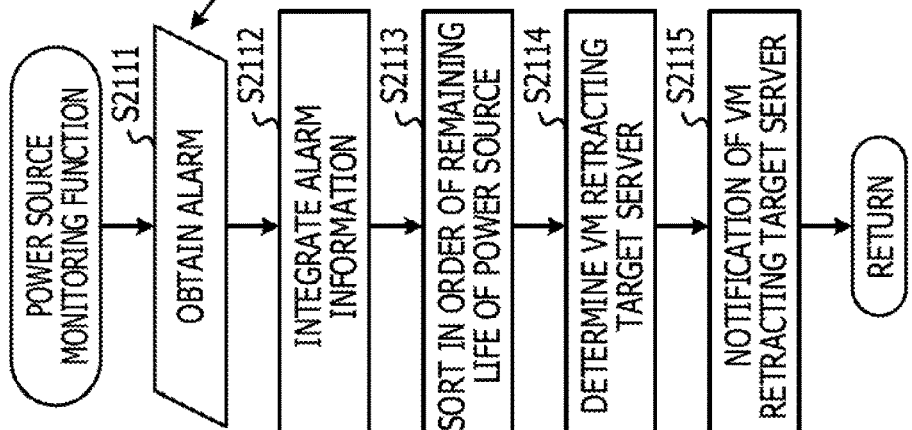
FIG. 23B is a flowchart of a process performed by a management server.
Figure 23A:
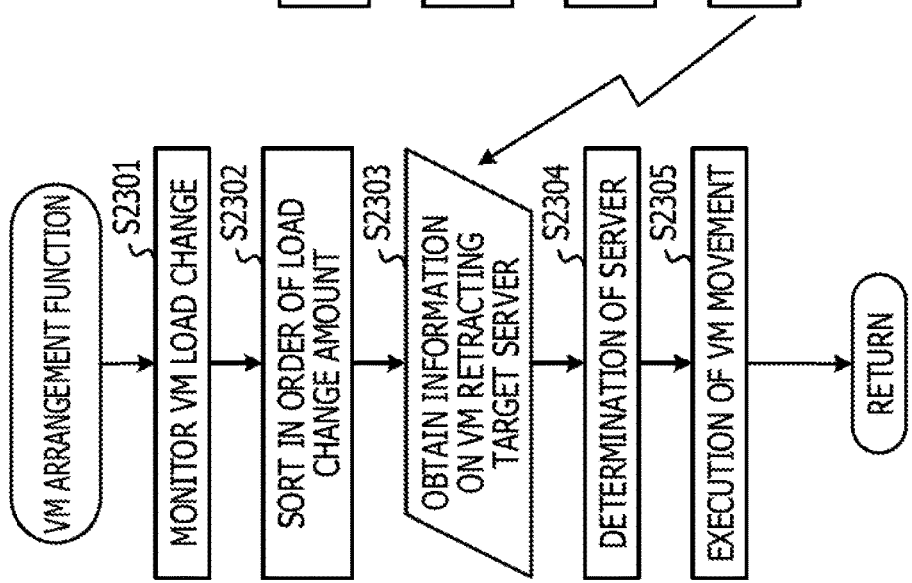
FIG. 23A is a flowchart of a process performed by a server.

FIG. 23A is a flowchart of a process of the servers 300a and 300b, FIG. 23B is a flowchart of a process of the management server 1801, and FIG. 23C is a flowchart of a process of the power source apparatuses 100a and 100b. The process performed by the servers 300a and 300b of FIG. 23A is different from the process performed by the servers 300a to 300d of FIG. 21A. The process performed by the management server 1801 of FIG. 23B is the same as the process performed by the management server 1801 of FIG. 21B. The process performed by the power source apparatuses 100a and 100b of FIG. 23C is the same as the process performed by the power source apparatuses 100a to 100d of FIG. 21C. Hereinafter, portions of FIGS. 23A to 23C which are different from FIGS. 21A to 21C will be described.

The process performed by the servers 300a and 300b of FIG. 23A will be described. In step S2301, virtual machine hypervisors included in the servers 300a and 300b monitor load changes of the virtual machines VM. In step S2302, the virtual machine hypervisors included in the servers 300a and 300b sort the virtual machines VM in order of an amount of load change. In step S2303, the virtual machine hypervisors included in the servers 300a and 300b receive and obtain information on a virtual machine retracting target server transmitted in step S2115. In step S2304, the virtual machine hypervisors included in the servers 300a and 300b determine the server 300b corresponding to the power source apparatus 100b having the short remaining life and the server 300a corresponding to the power source apparatus 100a having the long remaining life in accordance with the information on the virtual machine retracting target server. In step S2305, the virtual machine hypervisors included in the servers 300a and 300b move the virtual machines VM of a large load change in the server 300b corresponding to the power source apparatus 100b having the short remaining life to the server 300a corresponding to the power source apparatus 100a having the long remaining life, and move the virtual machines VM of a small load change in the server 300a corresponding to the power source apparatus 100a having the long remaining life to the server 300b corresponding to the power source apparatus 100b having the short remaining life. By this, a speed of reduction of the remaining life of the power source apparatus 100b may be reduced, the remaining lives of the power source apparatuses 100a and 100b may be leveled, and the number of times maintenance is performed may be reduced. Note that the process in FIG. 23A may be performed by the management server 1801.

As described above, the electrolytic capacitors 119 of the power source apparatuses 100a and 100b supply power source voltages to the corresponding servers 300a and 300b. The virtual machines VM are assigned to the servers 300a and 300b in accordance with the signals indicating the lives of the electrolytic capacitors 119.

Seventh Embodiment

Figure 24C:
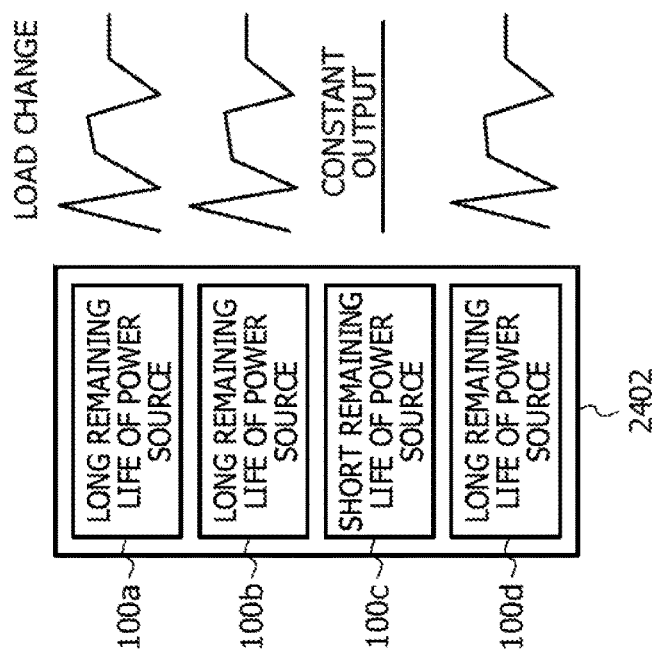
FIGS. 24A to 24C are diagrams illustrating a power source system according to a seventh embodiment.
Figure 24B:
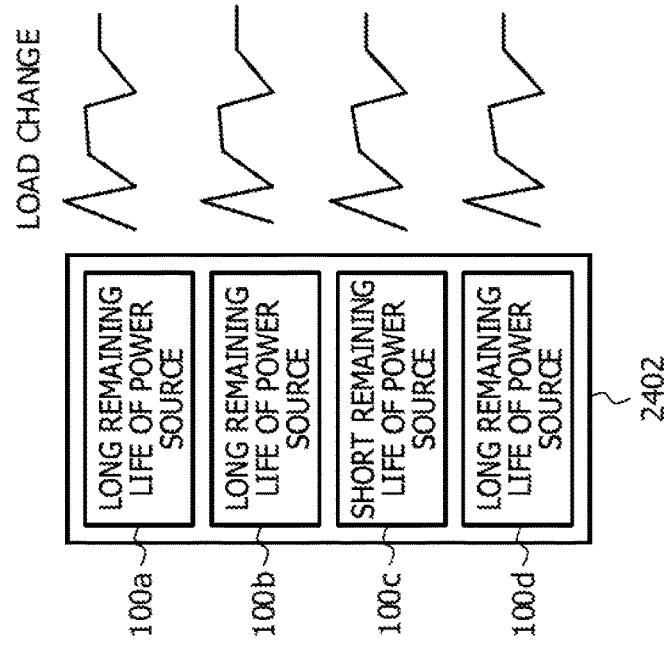
Figure 24A:
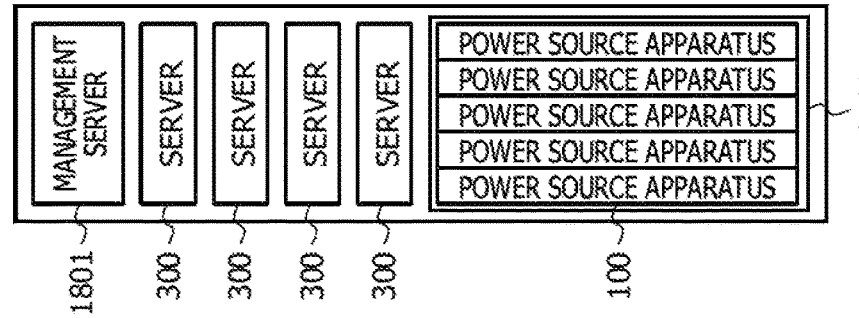

FIG. 24A is a diagram illustrating a configuration of a power source system according to a seventh embodiment. The power source system includes a rack 2401. The rack 2401 includes a management server 1801, a plurality of servers 300, and an integrated power source 2402. The integrated power source 2402 includes a plurality of power source apparatuses 100 which supply power source voltages to the servers 300 in parallel.

FIG. 24B is a diagram illustrating output voltages Vo of the power source apparatuses 100a to 100d before control. The integrated power source 2402 includes the plurality of power source apparatuses 100a to 100d. The power source apparatus 100a corresponds to a power source apparatus 100 having a long remaining life. The power source apparatus 100a corresponds a power source apparatus 100 having a long remaining life. The power source apparatus 100c corresponds a power source apparatus 100 having a short remaining life. The power source apparatus 100d corresponds a power source apparatus 100 having a long remaining life. The power source apparatuses 100a to 100d output voltages Vo controlled in accordance with load changes as described above. Consequently, the output voltages Vo of the power source apparatuses 100a to 100d are substantially the same.

FIG. 24C is a diagram illustrating the output voltages Vo of the power source apparatuses 100a to 100d after the control. The management server 1801 controls an operation mode of the power source apparatus 100c such that the output voltage Vo of the power source apparatus 100c having the short remaining life in the power source apparatuses 100a to 100d is fixed. In this embodiment, the power source apparatus 100c having the short remaining life performs a fixed-output operation and the power source apparatuses 100a, 100b, and 100d having the long lives perform power supply corresponding to the load changes. By this, a speed of reduction of the remaining life of the power source apparatus 100c may be reduced, the remaining lives of the power source apparatuses 100a and 100d may be leveled, and the number of times maintenance is performed may be reduced.

FIG. 25A is a flowchart of a process performed by the management server 1801, and FIG. 25B is a flowchart of a process performed by the power source apparatuses 100a to 100d. In step S2511, when each of the power source apparatuses 100a to 100d determines that the electrolytic capacitor 119 (the ESR 415) is deteriorated, the process proceeds to step S2512, and otherwise, the process proceeds to step S2513. In step S2512, the power source apparatuses 100a to 100d transmit alarm information indicating the remaining lives of the electrolytic capacitors 119 to the management server 1801.

In step S2501, the management server 1801 receives and obtains the alarm information from the power source apparatuses 100a to 100d. In step S2502, the management server 1801 integrates all the alarm information of the power source apparatuses 100a to 100d. In step S2503, the management server 1801 sorts the power source apparatuses 100a to 100d in order of remaining life based on the alarm information of the power source apparatuses 100a to 100d. In step S2504, the management server 1801 determines the power source apparatus 100c having the shortest remaining life as a fixed-output power source. In step S2505, the management server 1801 transmits fixed-output information to the power source apparatus 100c serving as the fixed-output power source.

In step S2513, when the power source apparatuses 100a to 100d receive the fixed-output information, the process proceeds to step S2514, and otherwise, the process in FIG. 25B is terminated. For example, since the power source apparatus 100 c receives the fixed-output information, the process proceeds to step S2514, whereas since the power source apparatuses 100a, 100b, and 100d do not receive the fixed-output information, the process in FIG. 25B is terminated. In step S2514, a PWM unit 203 of the power source apparatus 100c performs an output fixing operation so that the output voltage Vo is fixed.

As described above, when a signal indicating the life of the electrolytic capacitor 119 of the power source apparatus 100c is generated, the management server 1801 controls the PWM unit 203 so that the output voltage of the electrolytic capacitor 119 is fixed.

The microcomputer 129 of this embodiment may be realized when a computer executes a program. Furthermore, a computer readable recording medium which records the program and computer program products, such as the program described above may be included in embodiments of the present disclosure. Examples of the recording medium include a flexible disk, a hard disk, an optical disc, a magneto-optical disc, a compact disk read only memory (CD-ROM), a magnetic tape, a nonvolatile memory card, and a ROM.

The embodiments described above are merely embodied examples for implementing the present disclosure, and the technical scope of the present disclosure may not be limited by the embodiments. Specifically, the present disclosure may be embodied in various forms without departing from the technical spirits and the main features of the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A capacitor life diagnosis apparatus for diagnosing a life of a capacitor coupled to an output of a power source apparatus, the capacitor life diagnose apparatus comprising:
   a subtraction circuit configured to subtract an average output voltage of the power source apparatus from the output voltage of the power source apparatus and output a subtraction result as a voltage change of the output voltage of the power source apparatus;
   a first comparator configured to compare the voltage change with a first threshold value;
   a largest value detector configured to detect a largest value of the voltage change when the voltage change is larger than the first threshold value;
   a second comparator configured to compare the voltage change with a second threshold value which is calculated based on the largest value;
   an edge detector configured to detect edges of the voltage change at a time when a magnitude relationship between the voltage change and the second threshold value is reversed;
   a counter configured to count a number of the edges during a fixed period time; and
   a third comparator configured to compare the number of the edges with a third threshold value and detect that the capacitor is deteriorated, when the number of the edges exceeds the third threshold value.

2. The capacitor life diagnosis apparatus according to claim 1, further comprising:
   a switch that supplies electric power to the capacitor,
   wherein a cycle of a detection of the edges is longer than a switching cycle of the switch.

3. The capacitor life diagnosis apparatus according to claim 2, further comprising:
   a low-pass filter that attenuates ripple of the switching cycle of the switch in the output voltage; and
   an analog/digital converter that converts an analog output voltage of the low-pass filter into a digital output voltage to be output.

4. A capacitor life diagnosis apparatus for diagnosing a life of a capacitor coupled to an output of a power source apparatus, the capacitor life diagnose apparatus comprising:
   a subtraction circuit configured to subtract an average output voltage of the power source apparatus from the output voltage of the power source apparatus and output a subtraction result as a voltage change of the output voltage of the power source apparatus;
   a first comparator configured to compare the voltage change with a first threshold value;
   a largest value detector configured to detect a largest value of the voltage change when the voltage change is larger than the first threshold value;
   a second comparator configured to compare the voltage change with a second threshold value which is calculated based on the largest value;
   a timer configured to start a counting when the voltage change is larger than the first threshold value and stop the counting when the voltage change is smaller than the second threshold value; and
   a third comparator configured to detect the capacitor is deteriorated, when a count value which is counted by the timer is shorter than a third threshold value.

5. The capacitor life diagnosis apparatus according to claim 1, wherein a detection of ringing of the output voltage caused by a load change of the capacitor is performed when the voltage change is larger than the first threshold value.

6. The capacitor life diagnosis apparatus according to claim 2, further comprising:
a duty ratio calculator that calculates a duty ratio of a control pulse of the switch so that the output voltage becomes close to a target value; and
pulse generation circuitry that changes the calculated duty ratio by one pulse or several pulses and generates a control pulse of the switch based on the changed duty ratio,
wherein a detection of ringing in the output voltage caused by the change of the duty is performed when the voltage change is larger than the first threshold value.

7. The capacitor life diagnosis apparatus according to claim 2, further comprising:
a duty ratio calculator that calculates a duty ratio of a control pulse of the switch so that the output voltage becomes close to a target value;
pulse generation circuitry that generates a control pulse of the switch based on the calculated duty ratio; and
a controller that controls a response time of the duty ratio calculator to be delayed when the signal indicating the life of the capacitor is generated.

8. The capacitor life diagnosis apparatus according to claim 1, further comprising:
a server to which the power source voltage is supplied,
wherein the server assigns virtual machines in accordance with the signal indicating the life of the capacitor.

9. The capacitor life diagnosis apparatus according to claim 1, further comprising:
a server to which the power source voltage is supplied,
wherein the server assigns a number of virtual machines in accordance with the signal indicating the life of the capacitor.

10. The capacitor life diagnosis apparatus according to claim 2, further comprising:
pulse generation circuitry that generates a control pulse of the switch so that the output voltage becomes close to a target value; and
a controller that controls the pulse generation circuitry so that an output voltage of the capacitor is fixed when the signal indicating the life of the capacitor is generated.

11. A capacitor life diagnosis method for diagnosing a life of a capacitor coupled to an output end of a power source apparatus, the method comprising:
subtracting an average output voltage of the power source apparatus from the output voltage of the power source apparatus and outputting a subtraction result as a voltage change of the output voltage of the power source apparatus;
comparing the voltage change with a first threshold value;
detecting a largest value of the voltage change when the voltage change is larger than the first threshold value;
comparing the voltage change with a second threshold value which is calculated based on the largest value;
detecting edges of the voltage change at a time when a magnitude relationship between the voltage change and the second threshold value is reversed;
counting a number of the edges during a fixed time period;
comparing the number of the edges with a third threshold value; and
detecting that the capacitor is deteriorated, when the number of the edges exceeds the third threshold value.

12. The capacitor life diagnosis apparatus according to claim 1, further comprising:
a timer configured to start counting a timer count when the voltage change is larger than the first threshold value; and
a fourth comparator configured to compare the timer count with a fourth threshold value and set the fixed period time when the timer count is larger than the third threshold value.

* * * * *